United States Patent
Tsai et al.

(10) Patent No.: US 12,550,737 B2
(45) Date of Patent: Feb. 10, 2026

(54) SEMICONDUCTOR PACKAGE AND METHOD

(71) Applicant: Taiwan Semiconductor Manufacturing Co., Ltd., Hsinchu (TW)

(72) Inventors: Yu-Ling Tsai, Hsinchu (TW); Lai Wei Chih, Hsinchu (TW); Meng-Tsan Lee, Hsinchu (TW); Hung-Pin Chang, New Taipei (TW); Li-Han Hsu, Hsinchu (TW); Chien-Chia Chiu, Zhongli (TW); Cheng-Hung Lin, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 699 days.

(21) Appl. No.: 17/823,157

(22) Filed: Aug. 30, 2022

(65) Prior Publication Data
US 2024/0071947 A1    Feb. 29, 2024

(51) Int. Cl.
*H01L 23/00* (2006.01)
*H01L 23/053* (2006.01)
*H01L 25/18* (2023.01)

(52) U.S. Cl.
CPC ......... *H01L 23/562* (2013.01); *H01L 23/053* (2013.01); *H01L 25/18* (2013.01); *H01L 24/24* (2013.01); *H01L 24/97* (2013.01); *H01L 2224/24225* (2013.01); *H01L 2224/97* (2013.01)

(58) Field of Classification Search
CPC ..... H01L 23/562; H01L 23/053; H01L 25/18; H01L 24/24; H01L 24/97; H01L 2224/24225; H01L 2224/97
See application file for complete search history.

(56) References Cited

U.S. PATENT DOCUMENTS

| | | |
|---|---|---|
| 8,993,380 B2 | 3/2015 | Hou et al. |
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |

(Continued)

FOREIGN PATENT DOCUMENTS

| | | |
|---|---|---|
| TW | 202230646 A | 8/2022 |
| TW | 202232613 A | 8/2022 |

*Primary Examiner* — Peniel M Gumedzoe
(74) *Attorney, Agent, or Firm* — Slater Matsil, LLP

(57) ABSTRACT

A semiconductor package including a ring structure with one or more indents and a method of forming are provided. The semiconductor package may include a substrate, a first package component bonded to the substrate, wherein the first package component may include a first semiconductor die, a ring structure attached to the substrate, wherein the ring structure may encircle the first package component in a top view, and a lid structure attached to the ring structure. The ring structure may include a first segment, extending along a first edge of the substrate, and a second segment, extending along a second edge of the substrate. The first segment and the second segment may meet at a first corner of the ring structure, and a first indent of the ring structure may be disposed at the first corner of the ring structure.

20 Claims, 43 Drawing Sheets

(56) References Cited

U.S. PATENT DOCUMENTS

| | | | |
|---|---|---|---|
| 9,263,511 B2 | 2/2016 | Yu et al. | |
| 9,281,254 B2 | 3/2016 | Yu et al. | |
| 9,299,649 B2 | 3/2016 | Chiu et al. | |
| 9,368,460 B2 | 6/2016 | Yu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 10,629,545 B2 * | 4/2020 | Huang | H01L 23/562 |
| 2007/0069366 A1 * | 3/2007 | Chang | H01L 23/36 |
| | | | 257/E23.101 |
| 2013/0154085 A1 * | 6/2013 | Choi | H01L 23/36 |
| | | | 438/122 |
| 2020/0006289 A1 * | 1/2020 | Chang | H01L 23/3128 |
| 2020/0402882 A1 * | 12/2020 | Kim | H01L 23/055 |
| 2021/0305227 A1 * | 9/2021 | Chen | H01L 23/24 |
| 2022/0230969 A1 * | 7/2022 | Yeh | H01L 23/24 |
| 2022/0230990 A1 | 7/2022 | Yew et al. | |
| 2022/0238407 A1 | 7/2022 | Lin et al. | |
| 2022/0262768 A1 | 8/2022 | Chen et al. | |

* cited by examiner

SEMICONDUCTOR PACKAGE AND METHOD

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
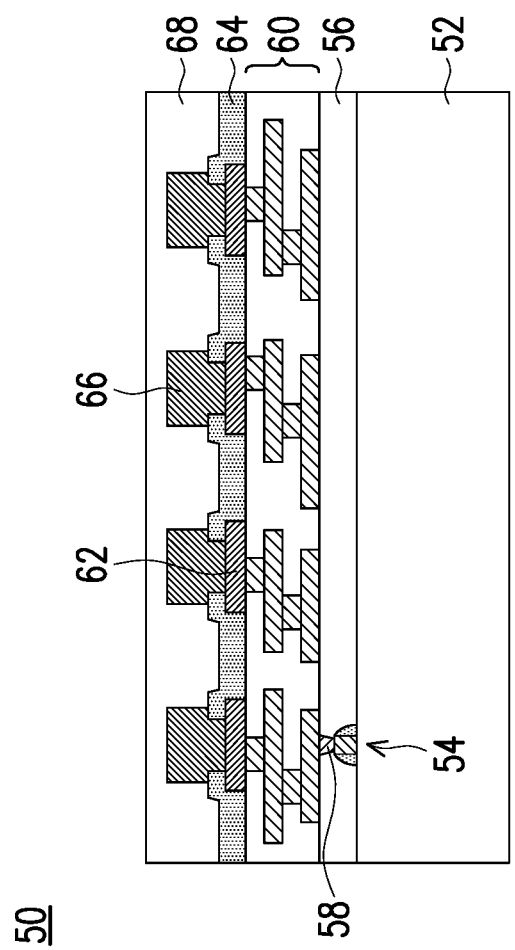
FIG. 1 illustrates a cross-sectional view of an integrated circuit die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor package with a lid having indents, a lid having protrusions, a stiffener ring having indents, a double stiffener rings combination, or the combination thereof, and the method of forming the same are provided. In accordance with some embodiments of the present disclosure, one or more package components comprising integrated circuit dies are bonded to a substrate. One or more stiffener rings of various configurations are attached on the substrate by an adhesive and encircle the one or more package components. The one or more stiffener rings provide additional support to the substrate during usage. A lid of various configurations is attached on the one or more stiffener rings and the one or more package components by other adhesives. The lid dissipates heat generated by the one or more package components during usage. The combination of the one or more stiffener rings of embodiment configurations and the lid of embodiment configurations described below may mitigate or eliminate the mismatch of the coefficients of thermal expansion between the lid and the one or more stiffener rings. As a result, embodiment lids and/or stiffener rings prevent or reduce delamination of the adhesives from the lid and the one or more stiffener rings during the usage of the semiconductor package, thereby improving long-term reliability of the semiconductor package.

Various embodiments may be described below in the context of a specific package configuration. Specifically, FIGS. 1 through 14A illustrate cross-sectional views of forming an integrated fan-out on substrate (InFO-oS) package configuration. It should be understood that various embodiments may also be adapted to apply to other package configurations. As a non-limiting example, FIG. 14B illustrates a cross-sectional view of integrated fan-out on substrate-local silicon interconnect (InFO-LSI) package, and FIG. 14C illustrates a chip on wafer on substrate (CoWoS®) package. Other package configurations are also possible.

FIG. 1 illustrates a cross-sectional view of an integrated circuit die 50 in accordance with some embodiments. The integrated circuit die 50 will be packaged in subsequent processing to form an integrated circuit package. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, a hybrid memory cube (HMC) module, a high bandwidth memory (HBM) module, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including silicon germanium, gallium arsenic phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices (represented by a transistor) 54 may be formed at the front surface of the semiconductor substrate 52. The devices 54 may be active devices (e.g., transistors, diodes, etc.), capacitors, resistors, etc. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. Source/drain region(s) may refer to a source or a drain, individually or collectively dependent upon the context. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit die 50 further includes pads 62, such as aluminum pads, to which external connections are made. The pads 62 are on the active side of the integrated circuit die 50, such as in and/or on the interconnect structure 60. One or more passivation films 64 are on the integrated circuit die 50, such as on portions of the interconnect structure 60 and pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the integrated circuit die 50.

Optionally, solder regions (e.g., solder balls or solder bumps) may be disposed on the pads 62. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing and are packaged, and dies, which fail the CP testing, are not packaged. After testing, the solder regions may be removed in subsequent processing steps.

A dielectric layer 68 may (or may not) be on the active side of the integrated circuit die 50, such as on the passivation films 64 and the die connectors 66. The dielectric layer 68 laterally encapsulates the die connectors 66, and the dielectric layer 68 is laterally coterminous with the integrated circuit die 50. Initially, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may bury the solder regions as well. Alternatively, the solder regions may be removed prior to forming the dielectric layer 68.

The dielectric layer 68 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 68 may be formed, for example, by spin coating, lamination, chemical vapor deposition (CVD), or the like. In some embodiments, the die connectors 66 are exposed through the dielectric layer 68 during formation of the integrated circuit die 50. In some embodiments, the die connectors 66 remain buried and are exposed during a subsequent process for packaging the integrated circuit die 50. Exposing the die connectors 66 may remove any solder regions that may be present on the die connectors 66.

In some embodiments, the integrated circuit die 50 is a stacked device that includes multiple semiconductor substrates 52. For example, the integrated circuit die 50 may be a memory device such as a hybrid memory cube (HMC) module, a high bandwidth memory (HBM) module, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure 60.

FIGS. 2 through 13 illustrate cross-sectional views of intermediate steps during a process for forming a first package component 100, in accordance with some embodiments. A first package region 100A and a second package region 100B are illustrated, and one or more of the integrated circuit dies 50 are packaged to form an integrated circuit package in each of the package regions 100A and 100B. Two package regions are illustrated as an example, more package regions may be formed. The integrated circuit packages may also be referred to as integrated fan-out (InFO) packages.

Figure 2:
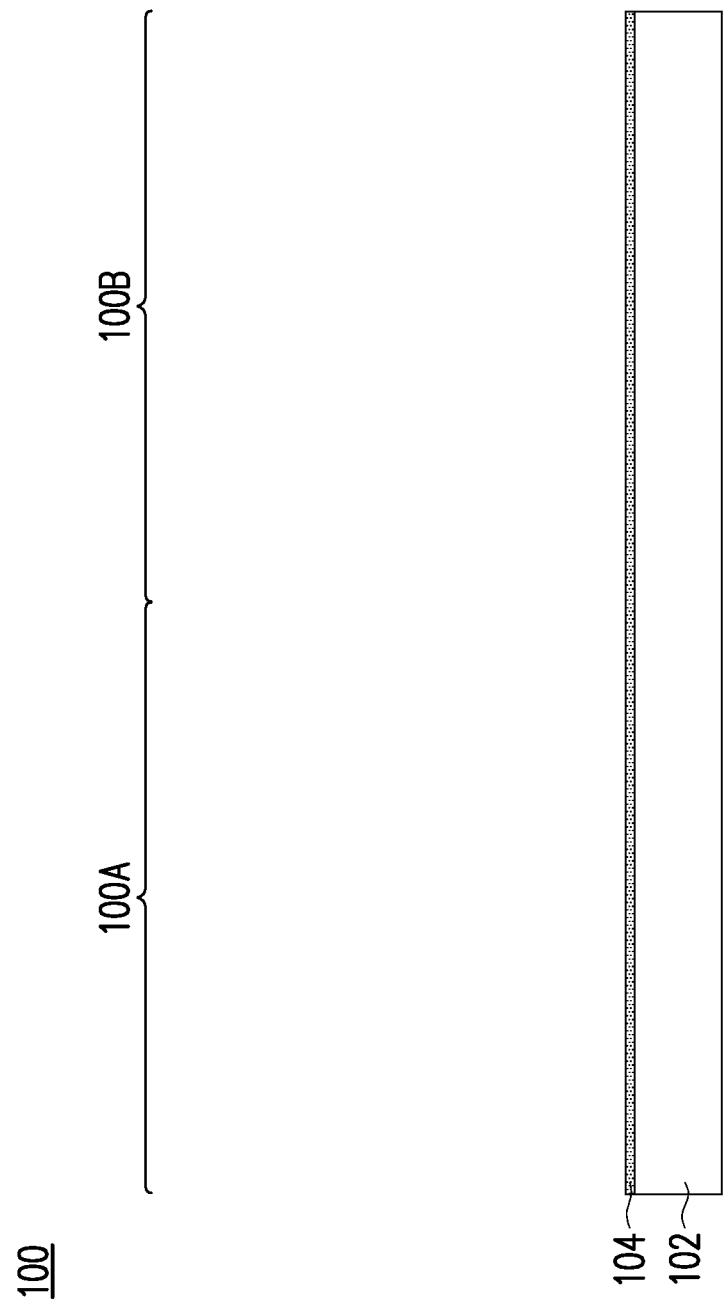
FIGS. 2 through 31D illustrate cross-sectional and top views of manufacturing processes for forming a package in accordance with some embodiments.

In FIG. 2, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be a ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Figure 3:
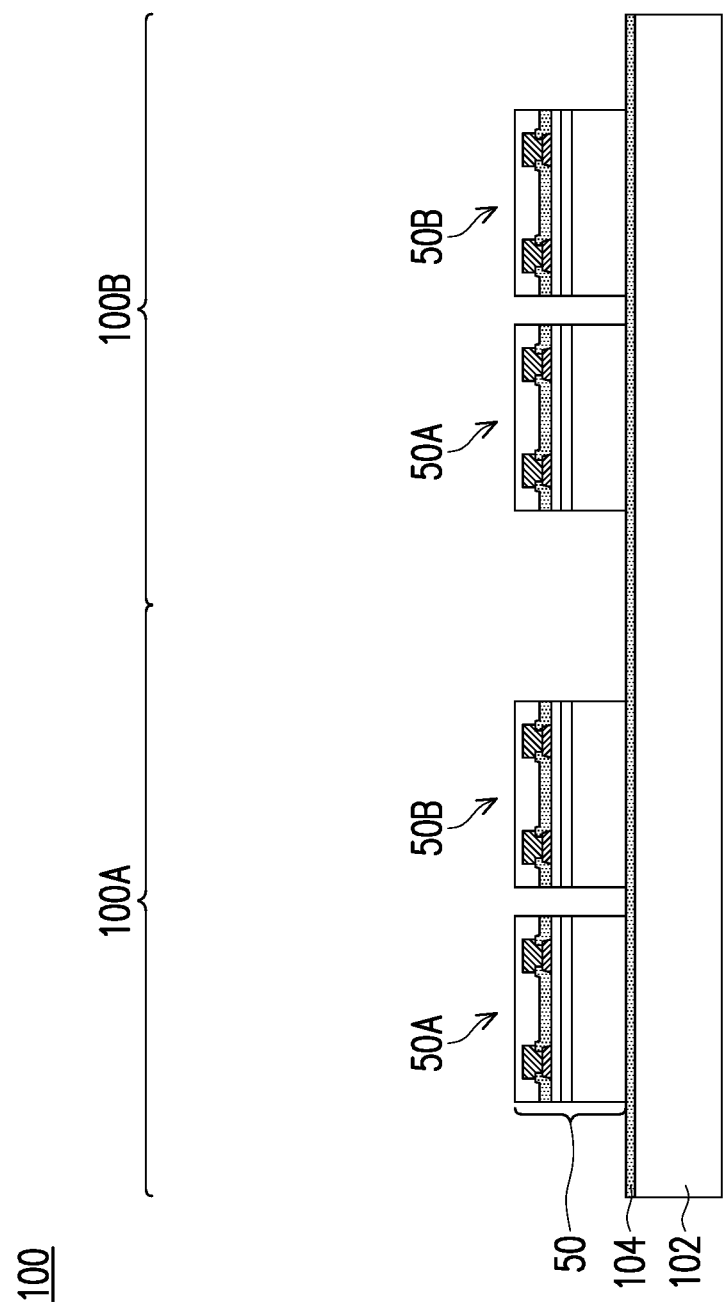

In FIG. 3, integrated circuit dies 50 (e.g., a first integrated circuit die 50A and a second integrated circuit die 50B) are adhered to the release layer 104. A desired type and quantity of integrated circuit dies 50 are adhered in each of the package regions 100A and 100B. In the embodiment shown, multiple integrated circuit dies 50 are adhered adjacent one another, including the first integrated circuit die 50A and the second integrated circuit die 50B in each of the first package region 100A and the second package region 100B. The first integrated circuit die 50A may be a logic device, such as a CPU, a GPU, a SoC, an AP, a microcontroller, or the like. The second integrated circuit die 50B may be a memory device, such as a DRAM die, an SRAM die, a hybrid memory cube (HMC) module, a high bandwidth memory (HBM) module, or the like. In some embodiments, the integrated circuit dies 50A and 50B may be the same type of dies, such as SoC dies. The first integrated circuit die 50A and second integrated circuit die 50B may be formed in processes of a same technology node, or may be formed in processes of different technology nodes. For example, the first integrated circuit die 50A may be of a more advanced process node than the second integrated circuit die 50B. The integrated circuit dies 50A and 50B may have different sizes (e.g., different heights and/or surface areas), or may have the same size (e.g., same heights and/or surface areas).

Figure 4:
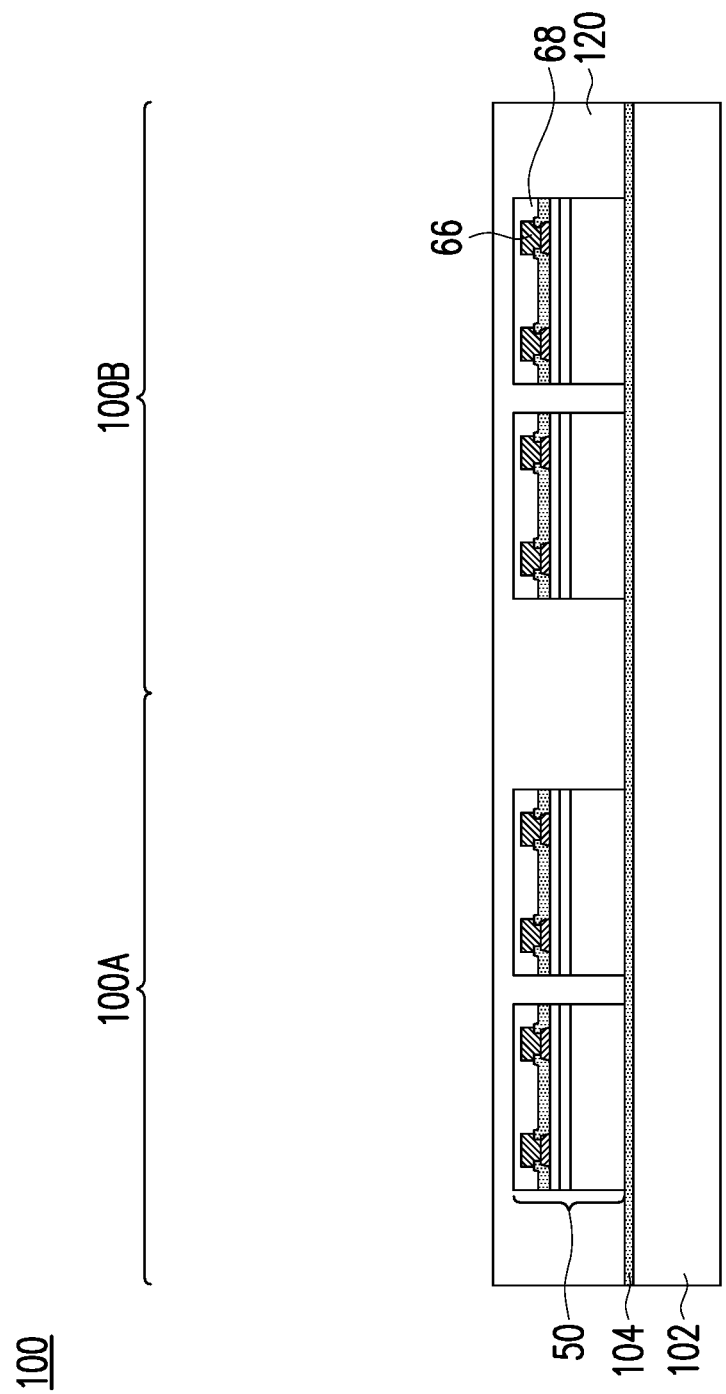

In FIG. 4, an encapsulant 120 is formed on and around the integrated circuit dies 50. After formation, the encapsulant 120 encapsulates the integrated circuit dies 50. The encapsulant 120 may be a molding compound, epoxy, or the like. The encapsulant 120 may be applied by compression molding, transfer molding, or the like, and may be formed over the carrier substrate 102 such that the integrated circuit dies 50 are buried or covered. The encapsulant 120 is further formed in gap regions between the integrated circuit dies 50. The encapsulant 120 may be applied in liquid or semi-liquid form and then subsequently cured.

Figure 5:
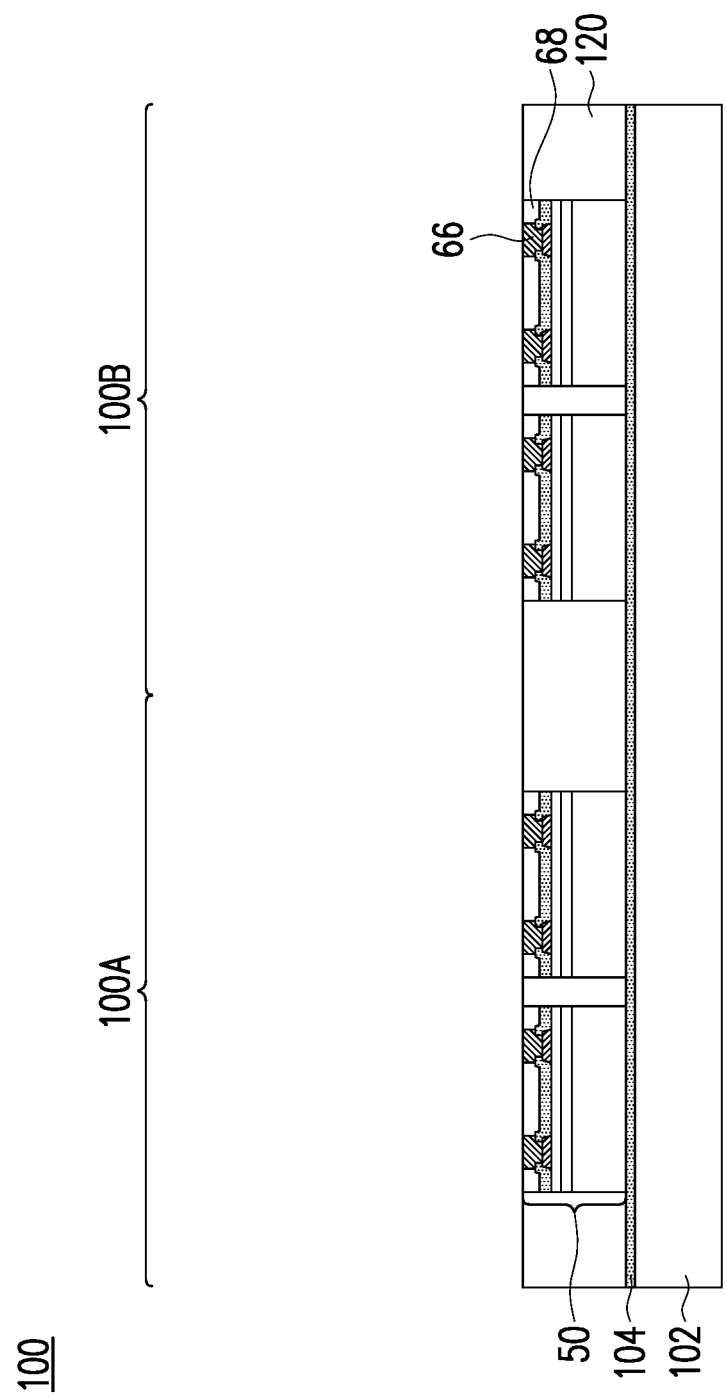

In FIG. 5, a planarization process is performed on the encapsulant 120 to expose the die connectors 66. The planarization process may also remove material of the dielectric layer 68 and/or the die connectors 66 until the die connectors 66 are exposed. Top surfaces of the die connectors 66, the dielectric layer 68, and the encapsulant 120 are substantially coplanar after the planarization process within process variations. The planarization process may be, for example, a chemical-mechanical polish (CMP), a grinding process, or the like. In some embodiments, the planarization may be omitted, for example, if the die connectors 66 are already exposed.

In FIGS. 6 through 9, a front-side redistribution structure 122 (see FIG. 9) is formed over the encapsulant 120 and integrated circuit dies 50. The front-side redistribution structure 122 includes dielectric layers 124, 128, 132, and 136; and metallization patterns 126, 130, and 134. The metallization patterns may also be referred to as redistribution layers or redistribution lines. The front-side redistribution structure 122 is shown as an example having three layers of metallization patterns. More or fewer dielectric layers and metallization patterns may be formed in the front-side redistribution structure 122. If fewer dielectric layers and metallization patterns are to be formed, steps and process discussed below may be omitted. If more dielectric layers and metallization patterns are to be formed, steps and processes discussed below may be repeated.

Figure 6:
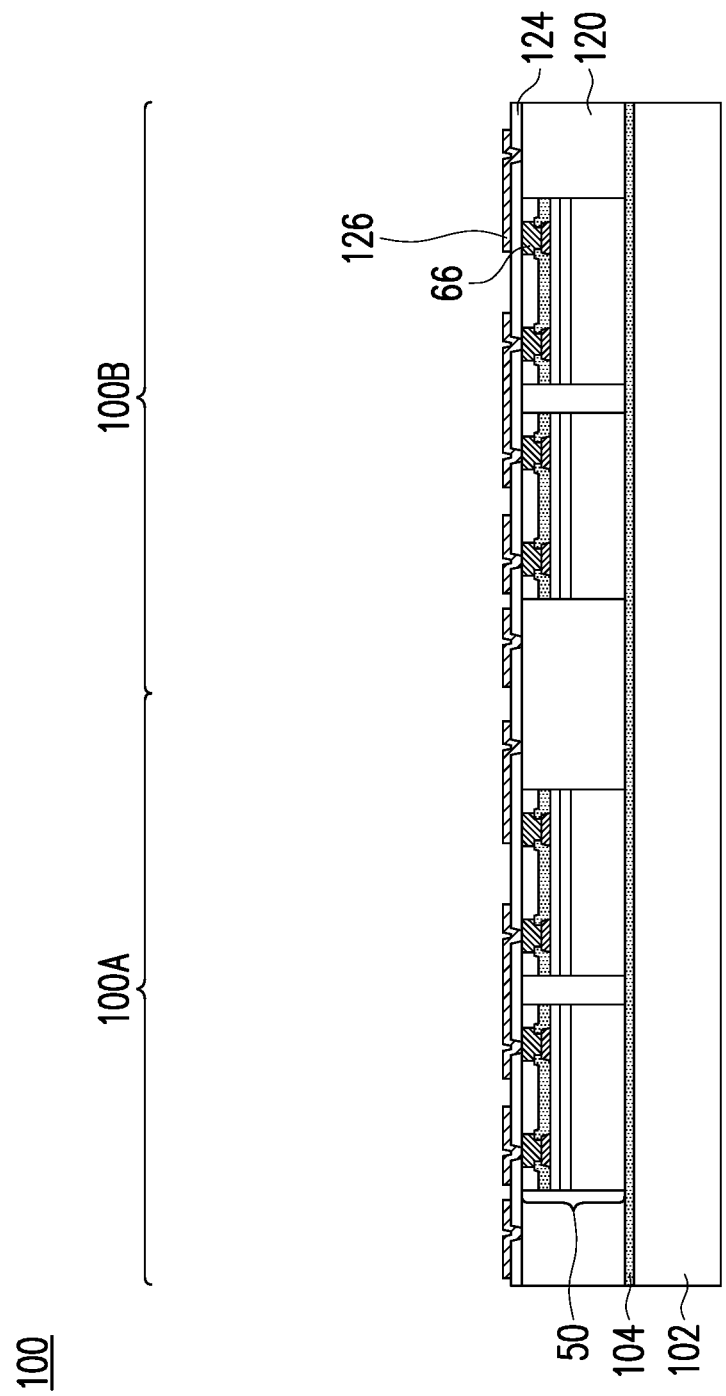

In FIG. 6, the dielectric layer 124 is deposited on the encapsulant 120 and die connectors 66. In some embodiments, the dielectric layer 124 is formed of a photo-sensitive material such as PBO, polyimide, BCB, or the like, which may be patterned using a lithography mask. The dielectric layer 124 may be formed by spin coating, lamination, CVD, the like, or a combination thereof. The dielectric layer 124 is then patterned. The patterning forms openings exposing portions of the die connectors 66. The patterning may be by an acceptable process, such as by exposing and developing the dielectric layer 124 to light when the dielectric layer 124 is a photo-sensitive material or by etching using, for example, an anisotropic etch.

The metallization pattern 126 is then formed. The metallization pattern 126 includes conductive elements extending along the major surface of the dielectric layer 124 and extending through the dielectric layer 124 to physically and electrically couple to the integrated circuit dies 50. As an example to form the metallization pattern 126, a seed layer is formed over the dielectric layer 124 and in the openings extending through the dielectric layer 124. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 126. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 126. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 7:
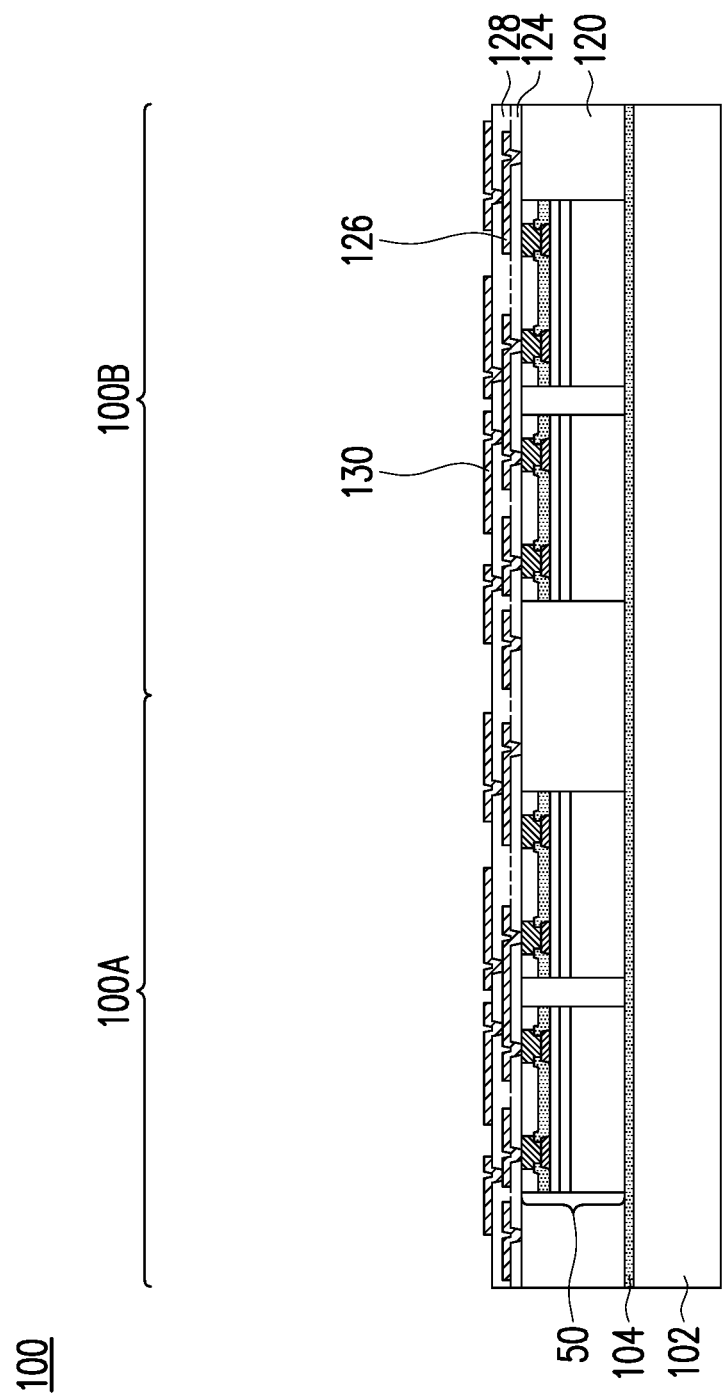

In FIG. 7, the dielectric layer 128 is deposited on the metallization pattern 126 and the dielectric layer 124. The dielectric layer 128 may be formed in a manner similar to the dielectric layer 124, and may be formed of a similar material as the dielectric layer 124.

The metallization pattern 130 is then formed. The metallization pattern 130 includes portions on and extending along the major surface of the dielectric layer 128. The metallization pattern 130 further includes portions extending through the dielectric layer 128 to physically and electrically couple the metallization pattern 126. The metallization pattern 130 may be formed in a similar manner and of a similar material as the metallization pattern 126. In some embodiments, the metallization pattern 130 has a different size than the metallization pattern 126. For example, the conductive lines and/or vias of the metallization pattern 130 may be wider or thicker than the conductive lines and/or vias of the metallization pattern 126. Further, the metallization pattern 130 may be formed to a greater pitch than the metallization pattern 126.

Figure 8:
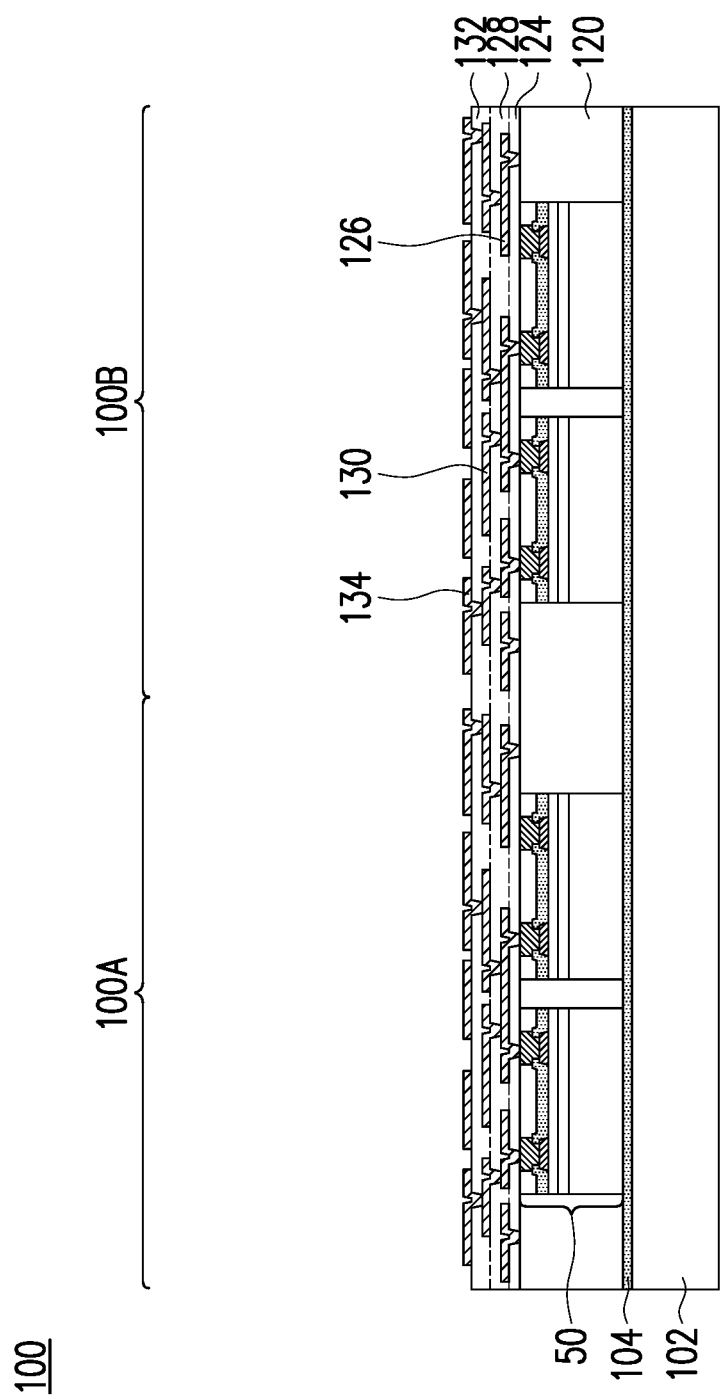

In FIG. 8, the dielectric layer 132 is deposited on the metallization pattern 130 and the dielectric layer 128. The dielectric layer 132 may be formed in a manner similar to the dielectric layer 124, and may be formed of a similar material as the dielectric layer 124.

The metallization pattern 134 is then formed. The metallization pattern 134 includes portions on and extending along the major surface of the dielectric layer 132. The metallization pattern 134 further includes portions extending through the dielectric layer 132 to physically and electrically couple the metallization pattern 130. The metallization pattern 134 may be formed in a similar manner and of a similar material as the metallization pattern 126. The metallization pattern 134 is the topmost metallization pattern of the front-side redistribution structure 122. As such, all of the intermediate metallization patterns of the front-side redistribution structure 122 (e.g., the metallization patterns 126 and 130) are disposed between the metallization pattern 134 and the integrated circuit dies 50. In some embodiments, the metallization pattern 134 has a different size than the metallization patterns 126 and 130. For example, the conductive lines and/or vias of the metallization pattern 134 may be wider or thicker than the conductive lines and/or vias of the metallization patterns 126 and 130. Further, the metallization pattern 134 may be formed to a greater pitch than the metallization pattern 130.

Figure 9:
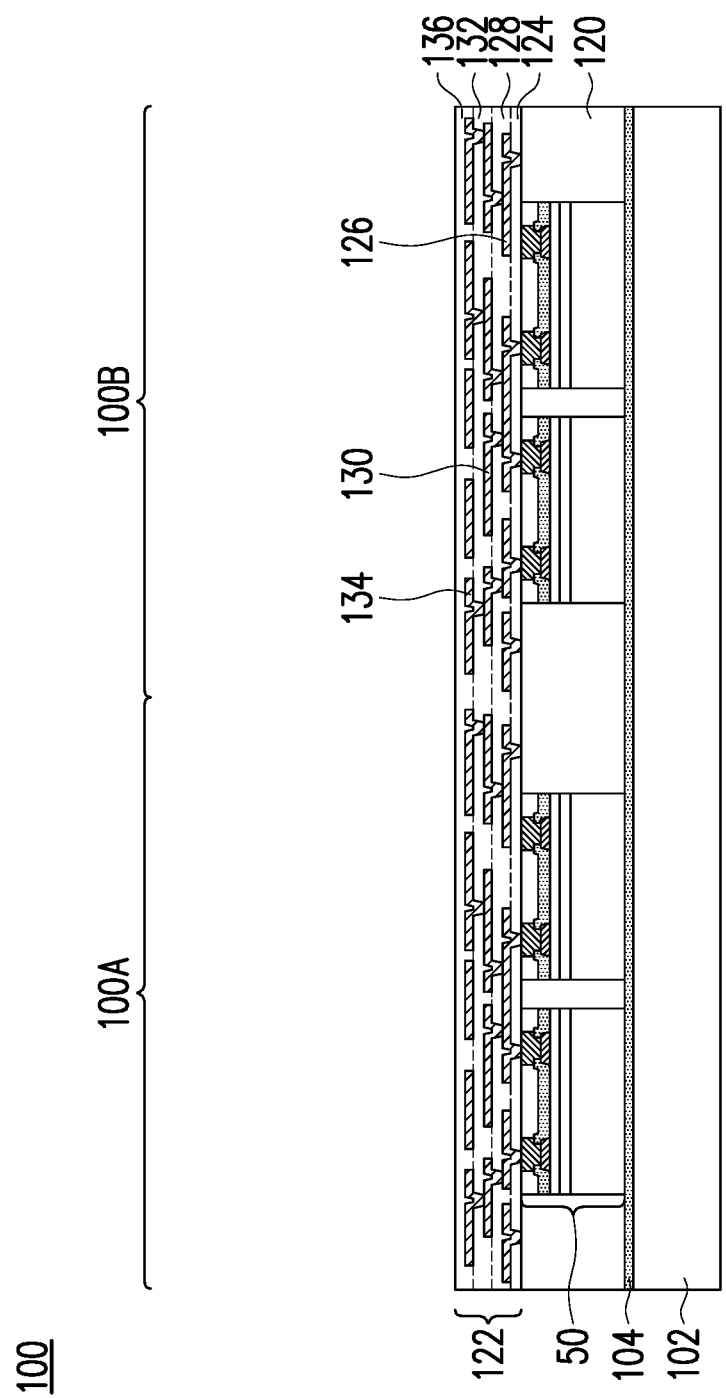

In FIG. 9, the dielectric layer 136 is deposited on the metallization pattern 134 and the dielectric layer 132. The dielectric layer 136 may be formed in a manner similar to the dielectric layer 124, and may be formed of the same material as the dielectric layer 124. The dielectric layer 136 is the topmost dielectric layer of the front-side redistribution structure 122. As such, all of the metallization patterns of the front-side redistribution structure 122 (e.g., the metallization patterns 126, 130, and 134) are disposed between the dielectric layer 136 and the integrated circuit dies 50. Further, all of the intermediate dielectric layers of the front-side redistribution structure 122 (e.g., the dielectric layers 124, 128, 132) are disposed between the dielectric layer 136 and the integrated circuit dies 50.

Figure 10:
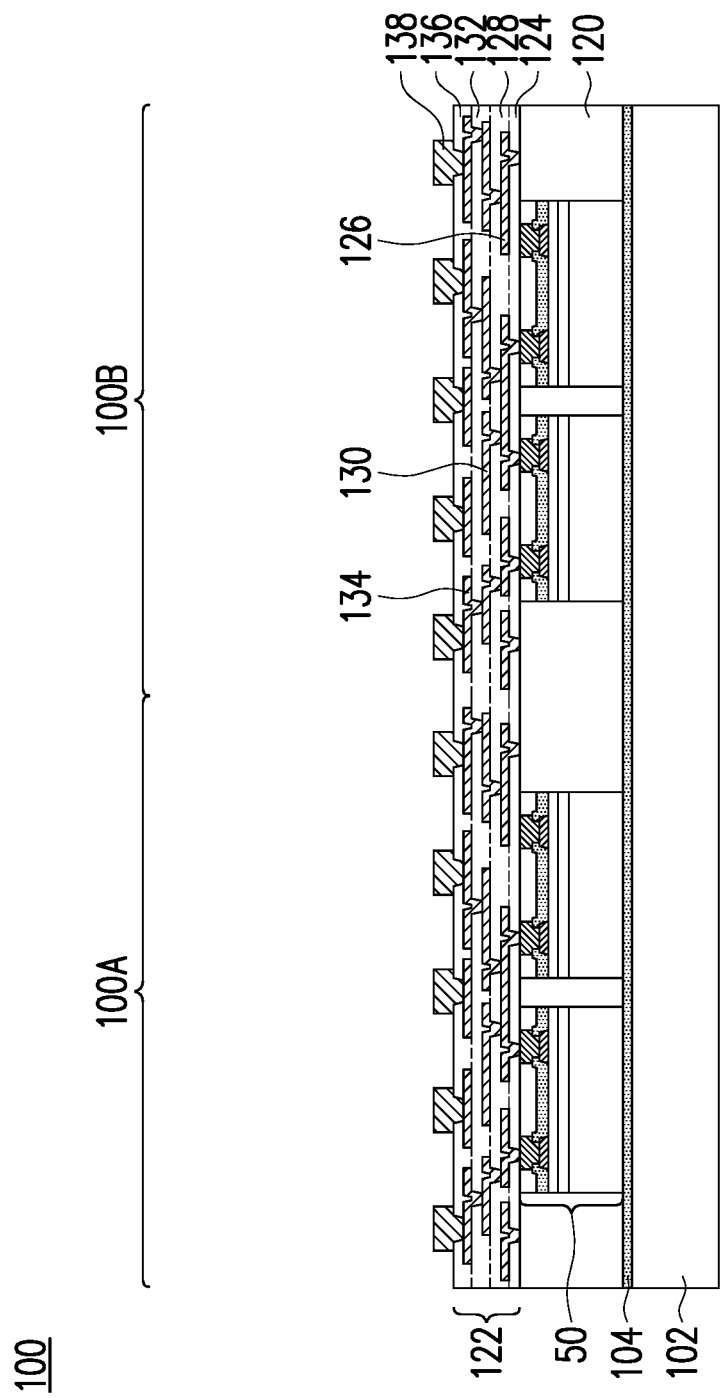

In FIG. 10, under-bump metallurgies (UBMs) 138 are formed for external connection to the front-side redistribution structure 122. The UBMs 138 have bump portions on and extending along the major surface of the dielectric layer 136, and have via portions extending through the dielectric layer 136 to physically and electrically couple to the metallization pattern 134. As a result, the UBMs 138 are electrically coupled to the through vias 116 and the integrated circuit dies 50. The UBMs 138 may be formed of the same material as the metallization pattern 126. In some embodiments, the UBMs 138 have a different size than the metallization patterns 126, 130, and 134.

Figure 11:
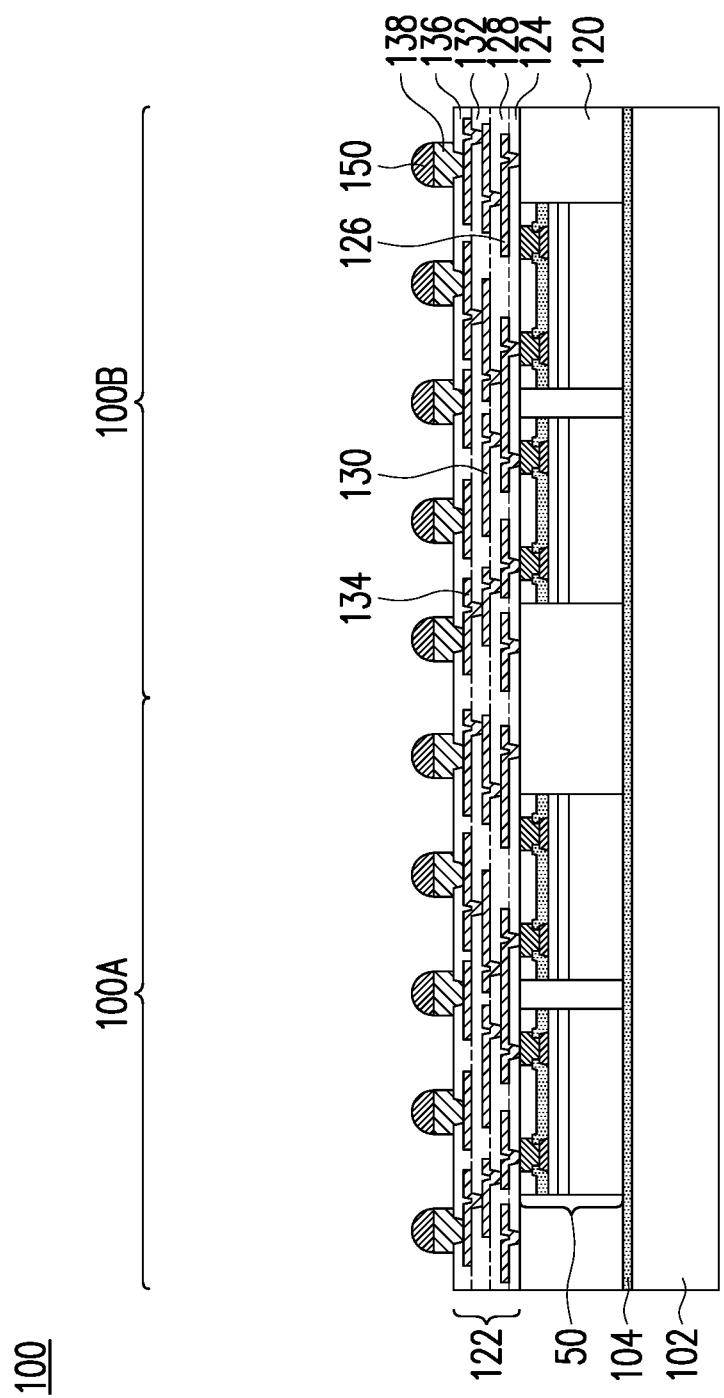

In FIG. 11, conductive connectors 150 are formed on the UBMs 138. The conductive connectors 150 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 150 may include a conductive material such as solder, copper, aluminum, gold, nickel, silver, palladium, tin, the like, or a combination thereof. In some embodiments, the conductive connectors 150 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 150 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 12:
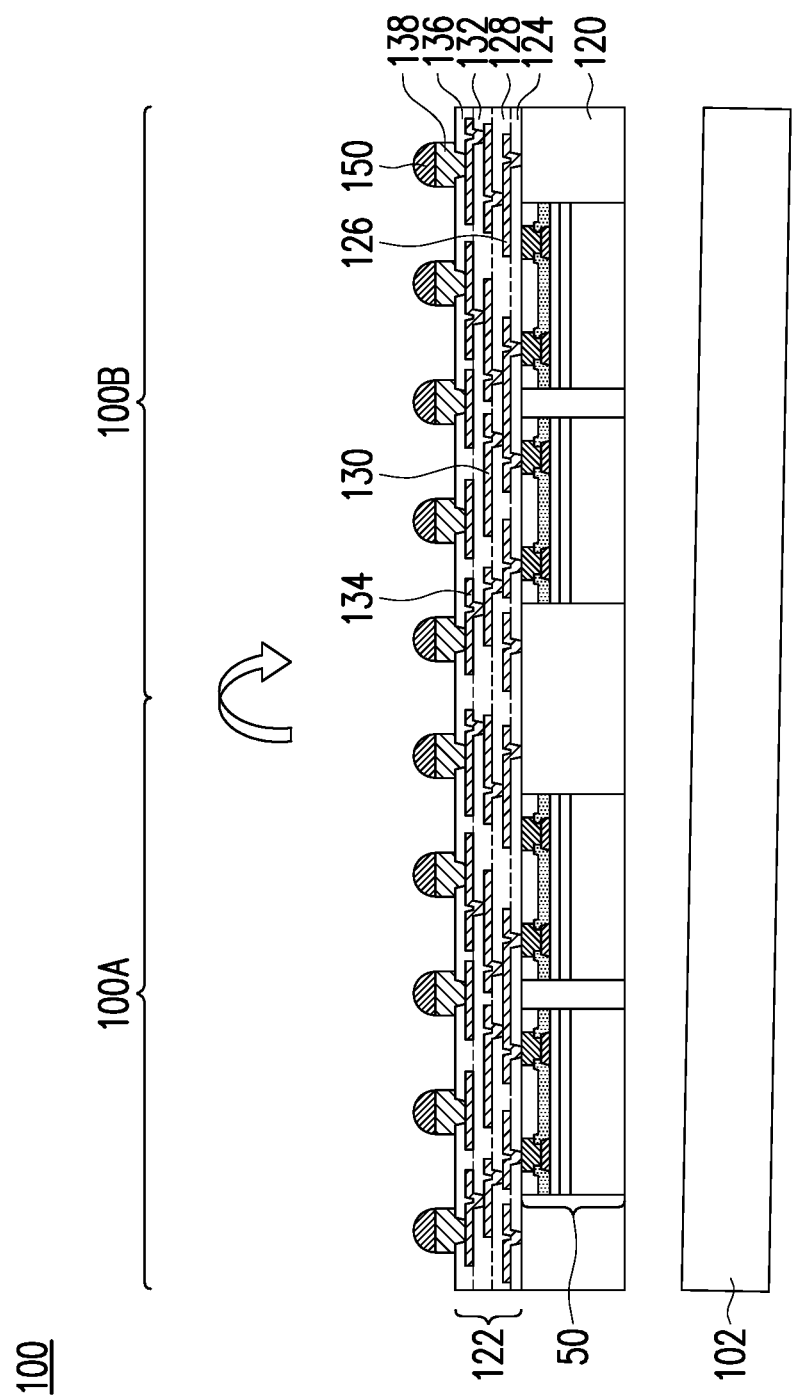

In FIG. 12, a carrier substrate de-bonding is performed to detach (or "de-bond") the carrier substrate 102 from the semiconductor substrates 52 and the encapsulant 120. In accordance with some embodiments, the de-bonding includes projecting a light such as a laser light or a UV light on the release layer 104 (not shown) so that the release layer 104 decomposes under the heat of the light and the carrier substrate 102 can be removed. The structure is then flipped over and placed on a tape (not shown).

Figure 13:
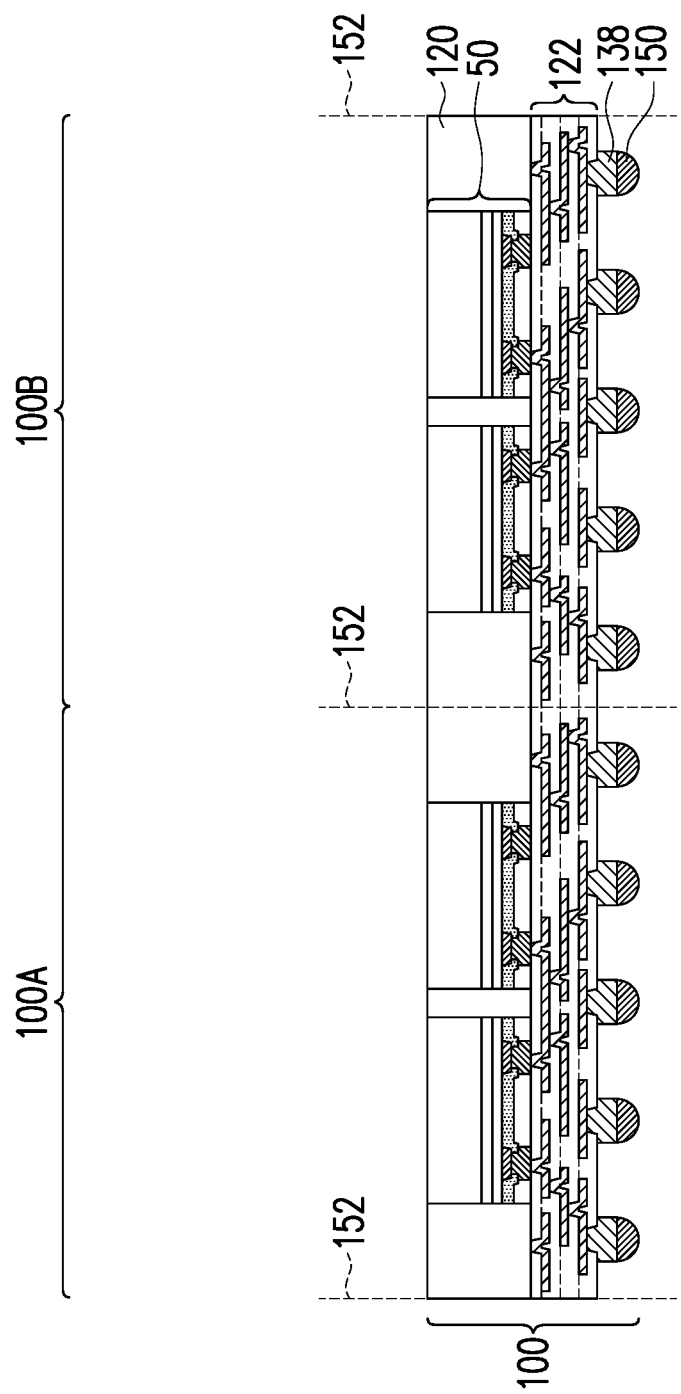

In FIG. 13, a singulation process is performed by sawing along scribe lines 152, between the first package region 100A and the second package region 100B, as well as between neighboring package regions and the first package region 100A and the second package region 100B. The sawing turns the first package region 100A and the second package region 100B into singulated first package components 100.

Figure 14A:
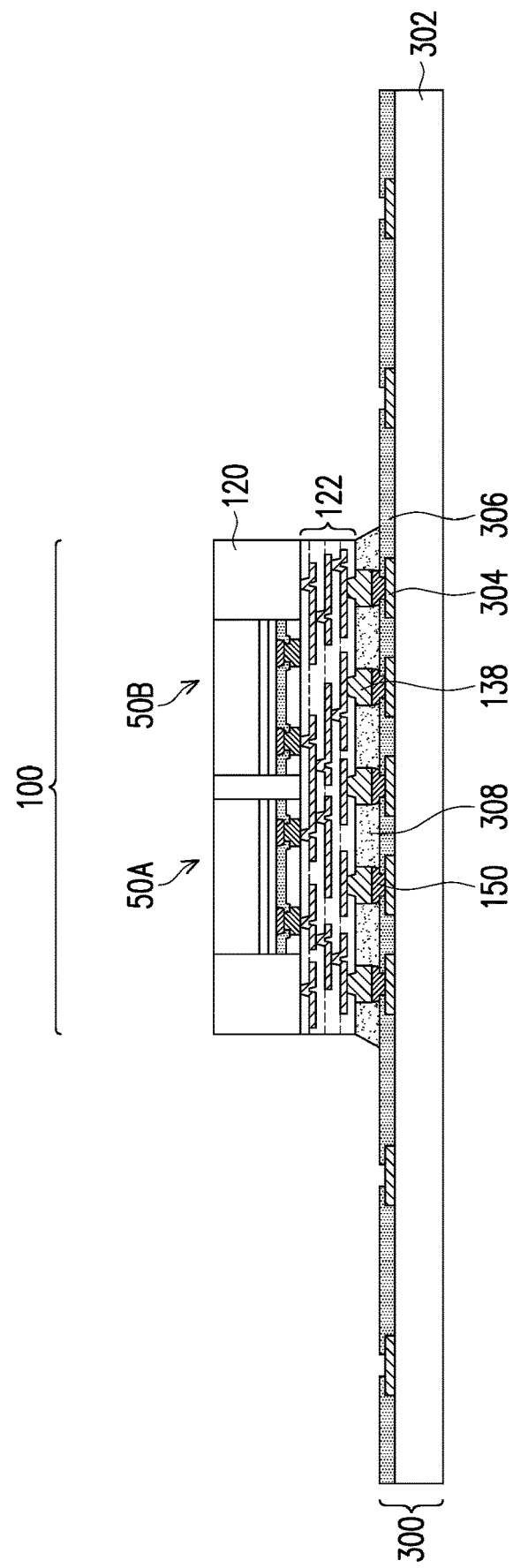
Figure 14B:
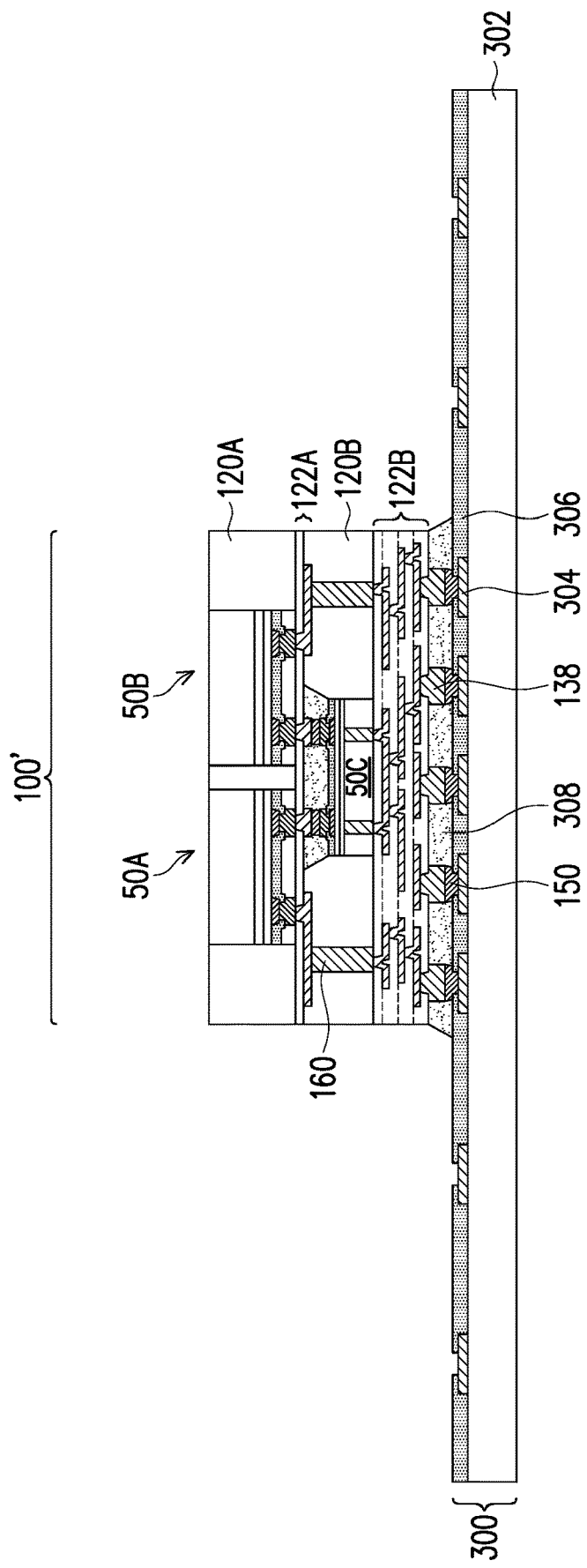
Figure 14C:
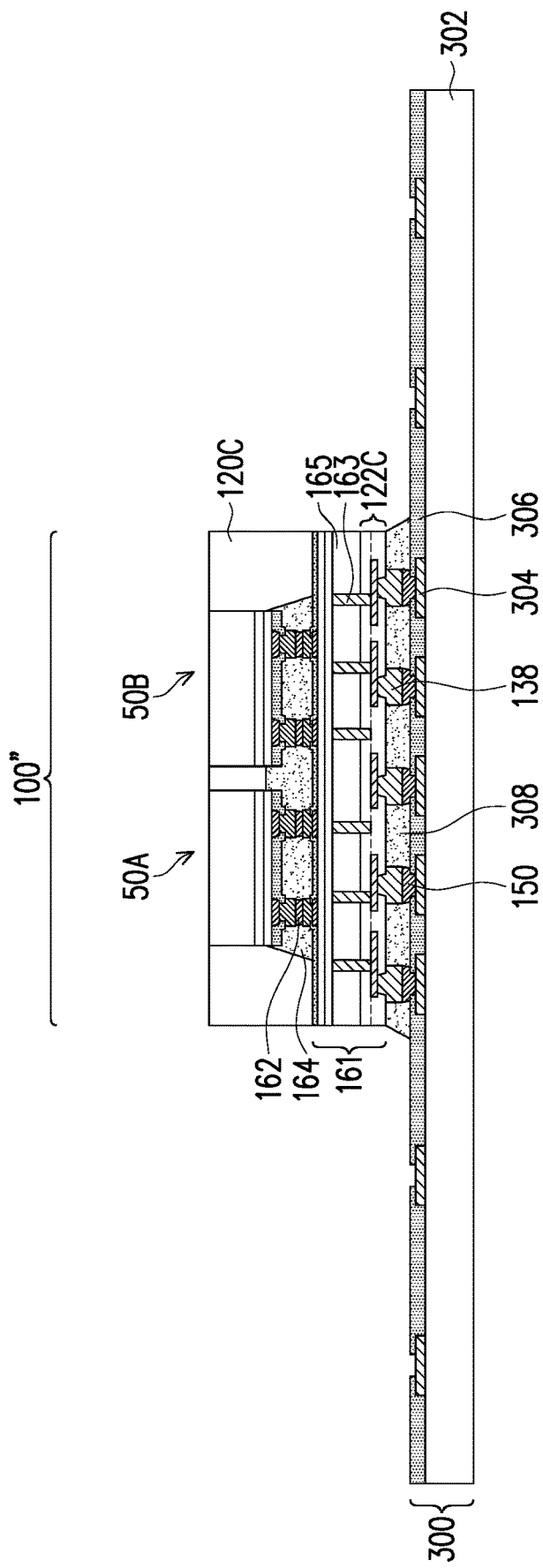

In FIG. 14A, singulated first package components 100 are mounted to a package substrate 300 using the conductive connectors 150 to form an InFO-oS package. In the illustrated cross-section of FIG. 15, a single first package component 100 is shown as being attached to the package substrate 300, but multiple first package components 100 may be attached to the package substrate 300 (see, e.g., the top view of FIG. 18A). Alternatively, only one first package component 100 may be attacked on the package substrate 300. The package substrate 300 includes a substrate core 302 and bond pads 304 over the substrate core 302. The substrate core 302 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 302 may be an SOI substrate. Generally, an SOI substrate includes a layer of a semiconductor material such as epitaxial silicon, germanium, silicon germanium, SOI, silicon germanium on insulator (SGOI), or combinations thereof. The substrate core 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other PCB materials or films. Build up films such as Ajinomoto build-up film (ABF) or other laminates may be used for substrate core 302. The package substrate 300 may have a coefficient of thermal expansion α1, which may be in a range from about $10 \times 10^{-6\circ}$ C.$^{-1}$ to about $16 \times 10^{-6\circ}$ C.$^{-1}$, such as $14 \times 10^{-6\circ}$ C.$^{-1}$.

The substrate core 302 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 302 may also include metallization layers and vias (not shown), with the bond pads 304 being physically and/or electrically coupled to the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate core 302 is substantially free of active and passive devices.

In some embodiments, the conductive connectors 150 are reflowed to attach the first package component 100 to the bond pads 304. The conductive connectors 150 electrically and/or physically couple the package substrate 300, including metallization layers in the substrate core 302, to the first package component 100. In some embodiments, a solder resist 306 is formed on the substrate core 302. The conductive connectors 150 may be disposed in openings in the solder resist 306 to be electrically and mechanically coupled to the bond pads 304. The solder resist 306 may be used to protect areas of the substrate core 302 from external damage.

The conductive connectors 150 may have an epoxy flux (not shown) formed thereon before they are reflowed with at least some of the epoxy portion of the epoxy flux remaining after the first package component 100 is attached to the package substrate 300. This remaining epoxy portion may act as an underfill to reduce stress and protect the joints resulting from reflowing the conductive connectors 150. In some embodiments, an underfill 308 may be formed between the first package component 100 and the package substrate 300 and surrounding the conductive connectors 150. The underfill 308 may be formed by a capillary flow process after the first package component 100 is attached or may be formed by a suitable deposition method before the first package component 100 is attached.

In some embodiments, passive devices (e.g., surface mount devices (SMDs), not shown) may also be attached to the first package component 100 (e.g., to the UBMs 138) or to the package substrate 300 (e.g., to the bond pads 304). For example, the passive devices may be bonded to a same surface of the first package component 100 or the package substrate 300 as the conductive connectors 150. The passive devices may be attached to the first package component 100 prior to mounting the first package component 100 on the package substrate 300, or may be attached to the package substrate 300 prior to or after mounting the first package component 100 on the package substrate 300.

FIG. 14A illustrates the first package component 100 as having a particular configuration (e.g., an InFO-oS configuration). In other embodiments, the first package component that is bonded to the package substrate 300 may have a different configuration.

For example, FIG. 14B illustrates an alternate configuration where a first package component 100' is bonded to the package substrate 300. The first package component 100' may be an InFO-LSI package comprising multiple levels of encapsulated die(s) and redistribution structures. Specifically, the first package component 100' may comprise integrated circuit dies 50A and 50B encapsulated in a first encapsulant 120A; a first redistribution structure 122A; an LSI die 50C encapsulated in a second encapsulant 120B; and a second redistribution structure 122B. The encapsulants 120A/120B and the redistribution structures 122A/122B may be substantially similar to the encapsulant 120 and the front-side redistribution structure 122 of the first package component 100 (see FIG. 14A), respectively. The LSI die 50C may be similar to the integrated circuit dies 50A/50B, but the LSI die 50C may be free of any active devices. The LSI dies 50C include interconnect layers that electrically connect the integrated circuit dies 50A and 50B to each other. In some embodiments, the LSI die 50C may include through substrate vias (TSVs), which provide electrical connections through the LSI die 50C. Further, through vias 160 may extend through the second encapsulant 120B to provide electrical connection between the first redistribution structure 122A and the second redistribution structure 122B.

As another example, FIG. 14C illustrates an alternate configuration where a first package component 100" is bonded to the package substrate 300. The first package component 100" may be a CoWoS package comprising integrated circuit dies 50A/50B encapsulated in an encapsulant 120C, an interposer 161, conductive connectors 162 electrically connecting the integrated circuit dies 50A/50B and the interposer 161, and an underfill 164 extending between the integrated circuit dies 50A/50B and the interposer 161. The encapsulant 120C may be substantially similar to the encapsulant 120 of the first package component 100 (see FIG. 14A). The conductive connectors 162 and the underfill 164 may be substantially similar to the conductive connectors 150 and the underfill 308 described with respect to FIG. 14A, respectively. The interposer 161 may comprise interconnect layers that electrically connect to the integrated circuit dies 50A/50B and may also connect the integrated circuit dies 50A/50B to each other, a back-side redistribution structure 122C (e.g., similar to the front-side redistribution structure 122 of the first package component 100, see FIG. 14A), and TSVs 163, which may provide electrical connections between the interconnect layers and back-side redistribution structure 122C through a semiconductor substrate 165. As an example of forming the CoWoS package, the integrated circuit dies 50A/50B may be flip chip bonded (e.g., solder bonded) to the interposer 161 while the interposer 161 is connected to other interposers as part of a wafer. Subsequently, a singulation process may be performed to separate the interposer 161 from the wafer.

The subsequent description provides various embodiments where the first package component 100 (see FIG. 14A) is bonded to the package substrate 300. It should be understood that any of the subsequent description may be applied to embodiments where the first package component 100' (see FIG. 14B) or the first package component 100" (see FIG. 14C) are bonded to the package substrate 300.

Figure 15:
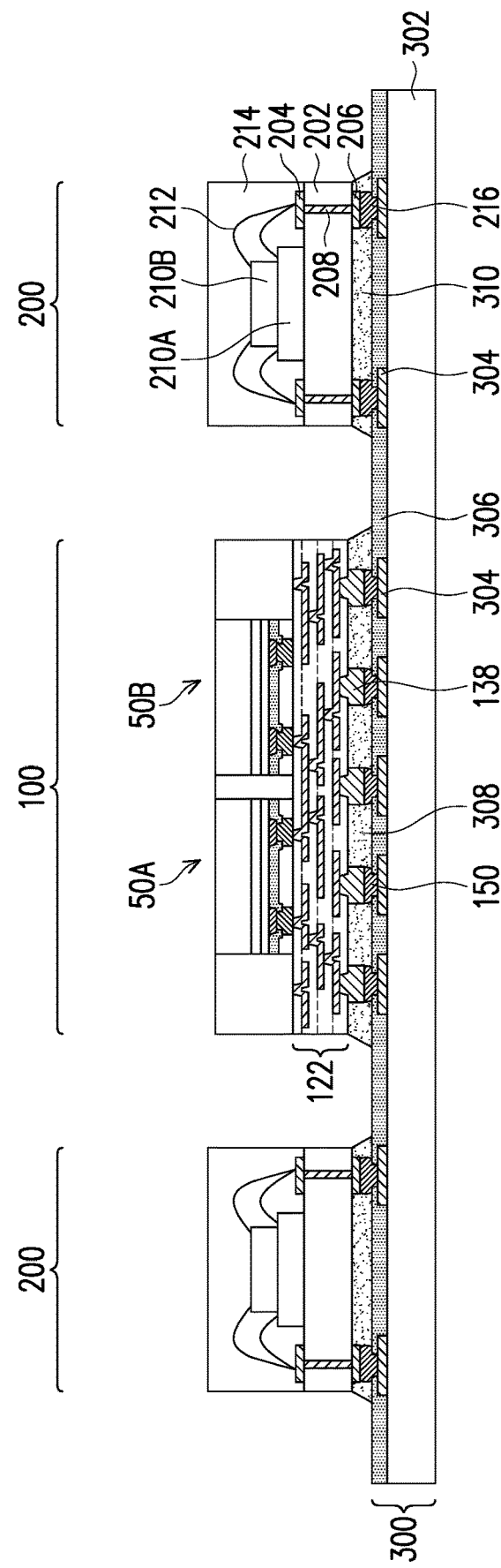

In FIG. 15, second package components 200 are mounted to the package substrate 300 using the conductive connectors 216. The second package components 200 may be disposed on a same surface of the package substrate 300 as the first package components 100. The second package components 200 include, for example, a substrate 202 and one or more stacked dies 210 (e.g., 210A and 210B) coupled to the substrate 202. Although one set of stacked dies 210 (210A and 210B) is illustrated, in other embodiments, a plurality of stacked dies 210 (each having one or more stacked dies) may be disposed side-by-side coupled to a same surface of the substrate 202. The substrate 202 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 202 may be an SOI substrate. Generally, an SOI substrate includes a layer of a semiconductor material such as epitaxial silicon, germanium, silicon germanium, SOI, SGOI, or combinations thereof. The substrate 202 is, in one alternative embodiment, based on an insulating core such as a fiberglass reinforced resin core. One example core material is fiberglass resin such as FR4. Alternatives for the core material include BT resin, or alternatively, other PCB materials or films. Build up films such as ABF or other laminates may be used for the substrate 202.

The substrate 202 may include active and passive devices (not shown). A wide variety of devices such as transistors, capacitors, resistors, combinations of these, and the like may be used to generate the structural and functional requirements of the design for the second package components 200. The devices may be formed using any suitable methods.

The substrate 202 may also include metallization layers (not shown) and the conductive vias 208. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate 202 is substantially free of active and passive devices.

The substrate 202 may have bond pads 204 on a first side of the substrate 202 to couple to the stacked dies 210, and bond pads 206 on a second side of the substrate 202, the second side being opposite the first side of the substrate 202. In some embodiments, the bond pads 204 and 206 are formed by forming recesses (not shown) into dielectric layers (not shown) on the first and second sides of the substrate 202. The recesses may be formed to allow the bond pads 204 and 206 to be embedded into the dielectric layers. In other embodiments, the recesses are omitted as the bond pads 204 and 206 may be formed on the dielectric layer. In some embodiments, the bond pads 204 and 206 include a thin seed layer (not shown) made of copper, titanium, nickel, gold, palladium, the like, or a combination thereof. The conductive material of the bond pads 204 and 206 may be deposited over the thin seed layer. The conductive material may be formed by an electro-chemical plating process, an electroless plating process, CVD, atomic layer deposition (ALD), PVD, the like, or a combination thereof. In an embodiment, the conductive material of the bond pads 204 and 206 is copper, tungsten, aluminum, silver, gold, the like, or a combination thereof.

In some embodiments, the bond pads 204 and the bond pads 206 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 204 and 206. Any suitable materials or layers of material that may be used for the bond pads 204 and 206 are fully intended to be included within the scope of the current application. In some embodiments, the conductive vias 208 extend through the substrate 202 and couple at least one of the bond pads 204 to at least one of the bond pads 206. The conductive connectors 216 are formed on the bond pads 206 in a manner similar to the conductive connectors 150, and may be formed of a similar material as the conductive connectors 150.

In the illustrated embodiment, the stacked dies 210 are coupled to the substrate 202 by wire bonds 212, although other connections may be used, such as conductive bumps. In an embodiment, the stacked dies 210 are stacked memory dies. For example, the stacked dies 210 may be memory dies such as low-power (LP) double data rate (DDR) memory modules, such as LPDDR1, LPDDR2, LPDDR3, LPDDR4, or the like memory modules.

The stacked dies 210 and the wire bonds 212 may be encapsulated by a molding material 214. The molding material 214 may be molded on the stacked dies 210 and the wire bonds 212, for example, using compression molding. In some embodiments, the molding material 214 is a molding compound, a polymer, an epoxy, silicon oxide filler material, the like, or a combination thereof. A curing process may be performed to cure the molding material 214; the curing process may be a thermal curing, a UV curing, the like, or a combination thereof.

In some embodiments, the stacked dies 210 and the wire bonds 212 are buried in the molding material 214, and after the curing of the molding material 214, a planarization step, such as a grinding, is performed to remove excess portions of the molding material 214 and provide a substantially planar surface for the second package components 200.

After the second package components 200 are formed, the second package components 200 are mechanically and electrically bonded to the package substrate 300 by the conductive connectors 216, which connect the bond pads 206 to the bond pads 304. In some embodiments, the stacked dies 210 may be coupled to the integrated circuit dies 50A and 50B through the wire bonds 212, the bond pads 204 and 206, the conductive vias 208, the conductive connectors 216, the bond pads 304, the metallization layers and vias in the substrate core 302, the conductive connectors 150, the UBMs 138, and the front-side redistribution structure 122.

In some embodiments, a solder resist 306 is formed on the substrate core 302. The conductive connectors 216 may be disposed in openings in the solder resist 306 to be electrically and mechanically coupled to the bond pads 304. The solder resist 306 may be used to protect areas of the substrate core 302 from external damage.

In some embodiments, the conductive connectors 216 have an epoxy flux (not shown) formed thereon before they are reflowed with at least some of the epoxy portion of the epoxy flux remaining after the second package components 200 are attached to the package substrate 300. In embodiments where the epoxy flux is formed, it may act as the underfill.

In some embodiments, an underfill 310 may be formed between the second package components 200 and the package substrate 300 and surrounding the conductive connectors 216. The underfill 308 may be formed by a capillary flow process after the second package components 200 are attached or may be formed by a suitable deposition method before the second package components 200 are attached. The underfill may reduce stress and protect the joints resulting from the reflowing of the conductive connectors 216.

Figure 16:
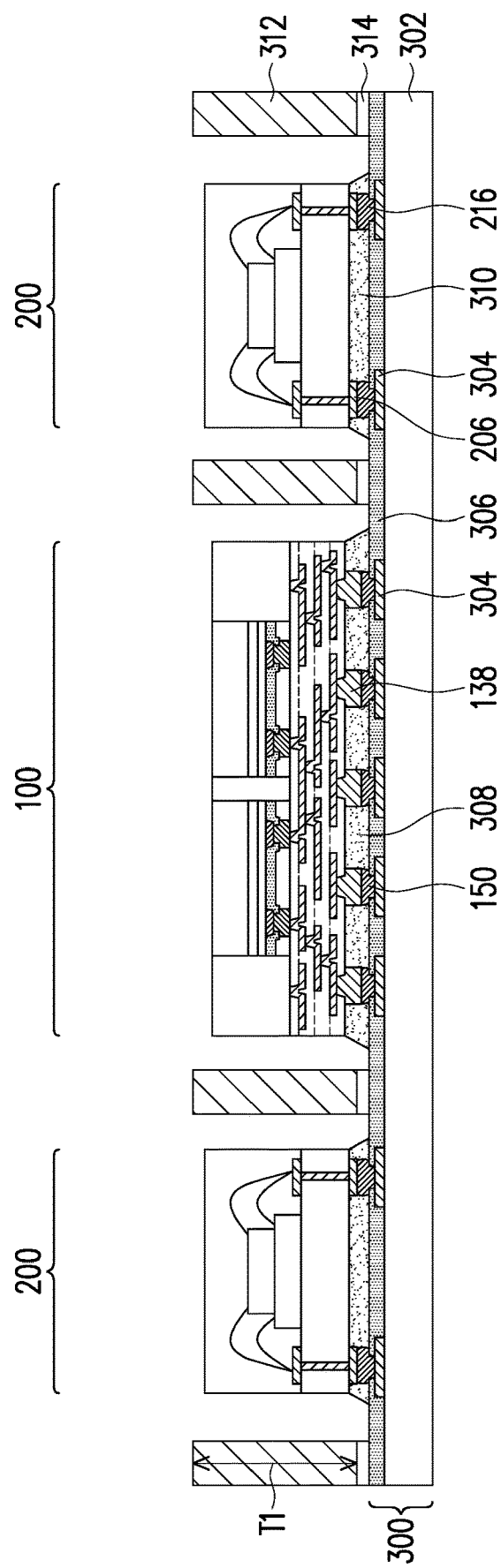

In FIG. 16, a stiffener ring 312 is attached to the package substrate 300. The stiffener ring 312 may be used to provide additional support to the package substrate 300 during subsequent manufacturing processes and usage to reduce warpage or other types of deformation of the package substrate 300. As discussed in greater details below, the stiffener ring 312 may encircle the first package components 100 and the second package components 200 as well as have segments that extend between the first package components 100 and the second package components 200. The stiffener ring 312 may be placed so that the stiffener ring 312 is laterally separated from the first package components 100, the second package components 200, the underfill 308, and the underfill 310. As discussed in greater details below, in some embodiments, the stiffener ring 312 may have indents at select locations, which may prevent or reduce the delamination of an adhesive from the stiffener ring 312 and a lid attached to the stiffener ring 312 by the adhesive.

The stiffener ring 312 may have a coefficient of thermal expansion α2, which may be in a range from about $2\times10^{-6\circ}$ C.$^{-1}$ to about $12\times10^{-6\circ}$ C.$^{-1}$, such as $3.9\times10^{-6\circ}$ C.$^{-1}$. In some embodiments, the stiffener ring 312 with the coefficient of thermal expansion α2 in the range from about $2\times10^{-6\circ}$ C.$^{-1}$ to about $12\times10^{-6\circ}$ C.$^{-1}$ may improve the reliability of the encapsulant 120 and the front-side redistribution structure 122 of the first package components 100 during operation. In some embodiments, the stiffener ring 312 may comprise a metal alloy or the like. For example, the stiffener ring 312 may comprise an iron-nickel alloy, which comprises about 55% to about 65% iron and about 35% to about 45% nickel, such as Alloy 42. As another example, the stiffener ring 312 may comprise an iron-chromium alloy, which comprises about 82% to about 86% iron and about 14% to about 18% chromium, such as Stainless Steel 430. As another example, the stiffener ring 312 may comprise an iron-nickel-cobalt alloy, which comprises about 54% iron, about 29% nickel, and about 17% cobalt, such as Kovar. As another example, the stiffener ring 312 may comprise a tungsten-copper alloy, which comprises about 70% to about 90% tungsten and about 10% to about 30% copper. As another example, the stiffener ring 312 may comprise a molybdenum-copper alloy, which comprises about 50% to about 85% molybdenum and about 15% to about 50% copper. The stiffener ring 312 may have a thickness T1 in a range from about 1 mm to about 1.7 mm, such as about 1.24 mm.

The stiffener ring 312 may be attached utilizing an adhesive 314, such as an epoxy, glue, polymeric material, solder paste, thermal adhesive, or the like. FIG. 16 shows the stiffener ring 312 having a greater thickness than the second package components 200 and the second package components 200 having a greater thickness than the first package components 100 as an example. Other thicknesses of the first package components 100, the second package components 200, and the stiffener ring 312 are possible.

Figure 17:
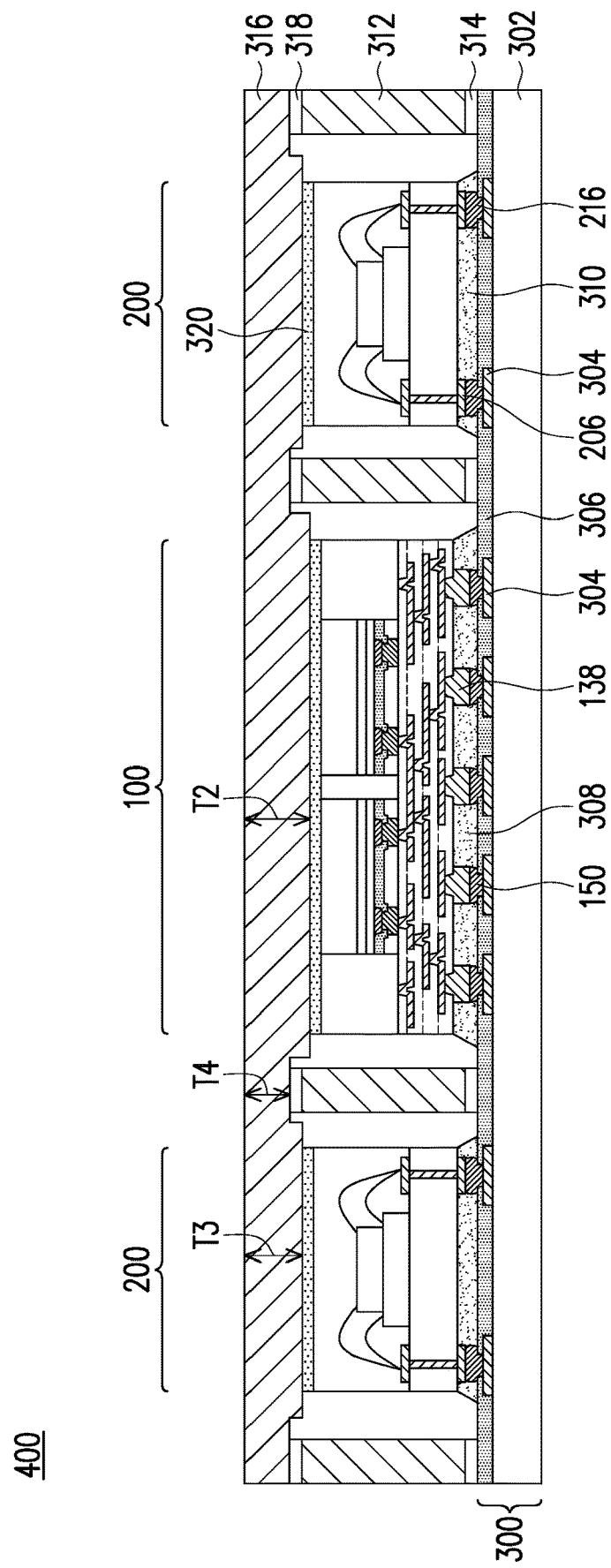

In FIG. 17, a lid 316 is attached to the first package components 100, the second package components 200, and the stiffener ring 312. The lid 316 may dissipate the heat generated by the first package components 100 and the second package components 200 during operation. As discussed in greater details below, in some embodiments, the lid 316 may have indents at select locations, which may prevent or reduce the delamination of an adhesive from the stiffener ring 312 and the lid 316. The lid 316 may comprise a material with high thermal conductivity, such as copper, stainless steel, or the like. The lid 316 may have a coefficient of thermal expansion α3, which may be in a range from about $14\times10^{-6\circ}$ C.$^{-1}$ to about $18\times10^{-6\circ}$ C.$^{-1}$, such as $16\times10^{-6\circ}$ C.$^{-1}$. In some embodiments, the coefficient of thermal expansion α3 of the lid 316 may be greater than the coefficient of thermal expansion α2 of the stiffener ring 312. FIG. 17 shows the lid 316 and the package substrate 300 having the same width as an example. The lid 316 may be wider or narrower than the package substrate 300.

An adhesive 318 is used to attach the lid 316 to the stiffener ring 312. The adhesive 318 may comprise the same or similar materials as the adhesive 314. An adhesive 320 is used to attach the lid 316 to the first package components 100 and the second package components 200. The adhesive 320 may comprise a thermal interface material (TIM), which may be a material with high thermal conductivity, such as, thermal paste, gel-based thermal adhesive, graphite, graphene film, the like, or the combinations thereof.

The portions of the lid 316 that are disposed over the first package components 100 may have a thickness T2, which may be in a range from about 0.3 mm to about 2 mm, such as about 1 mm. The portions of the lid 316 that are disposed over the second package component 200 may have a thickness T3, which may be in a range from about 0.3 mm to about 2 mm, such as about 0.83 mm. The portions of the lid 316 that are disposed over the stiffener ring 312 may have a thickness T4 which may be in a range from about 0.3 mm to about 2 mm, such as about 0.5 mm. In some embodiments, the thickness T2 may be greater than the thickness T3, and the thickness T3 may be greater than the thickness T4. The structure shown in FIG. 17 may be referred to as package 400.

Figure 18A:
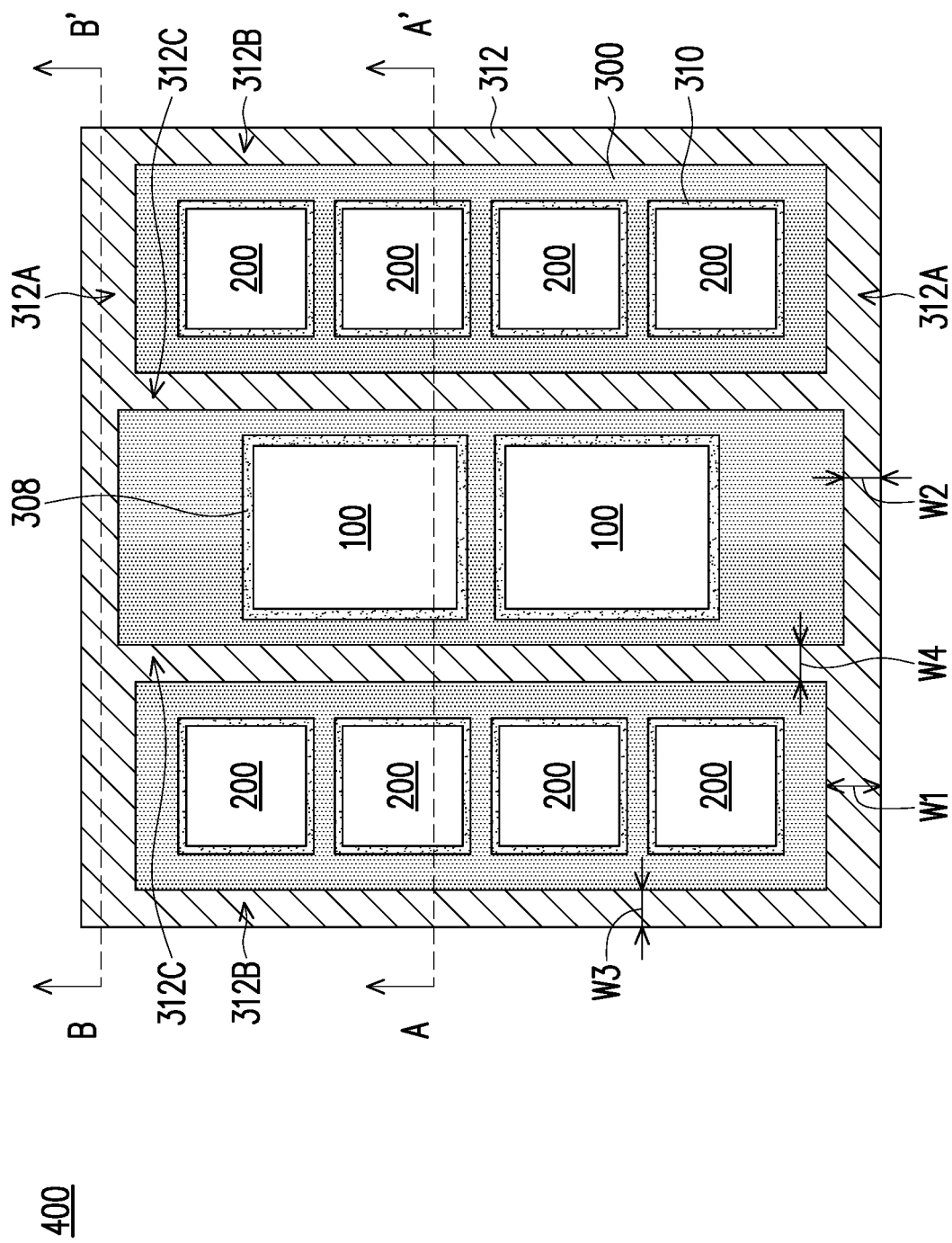
Figure 18B:
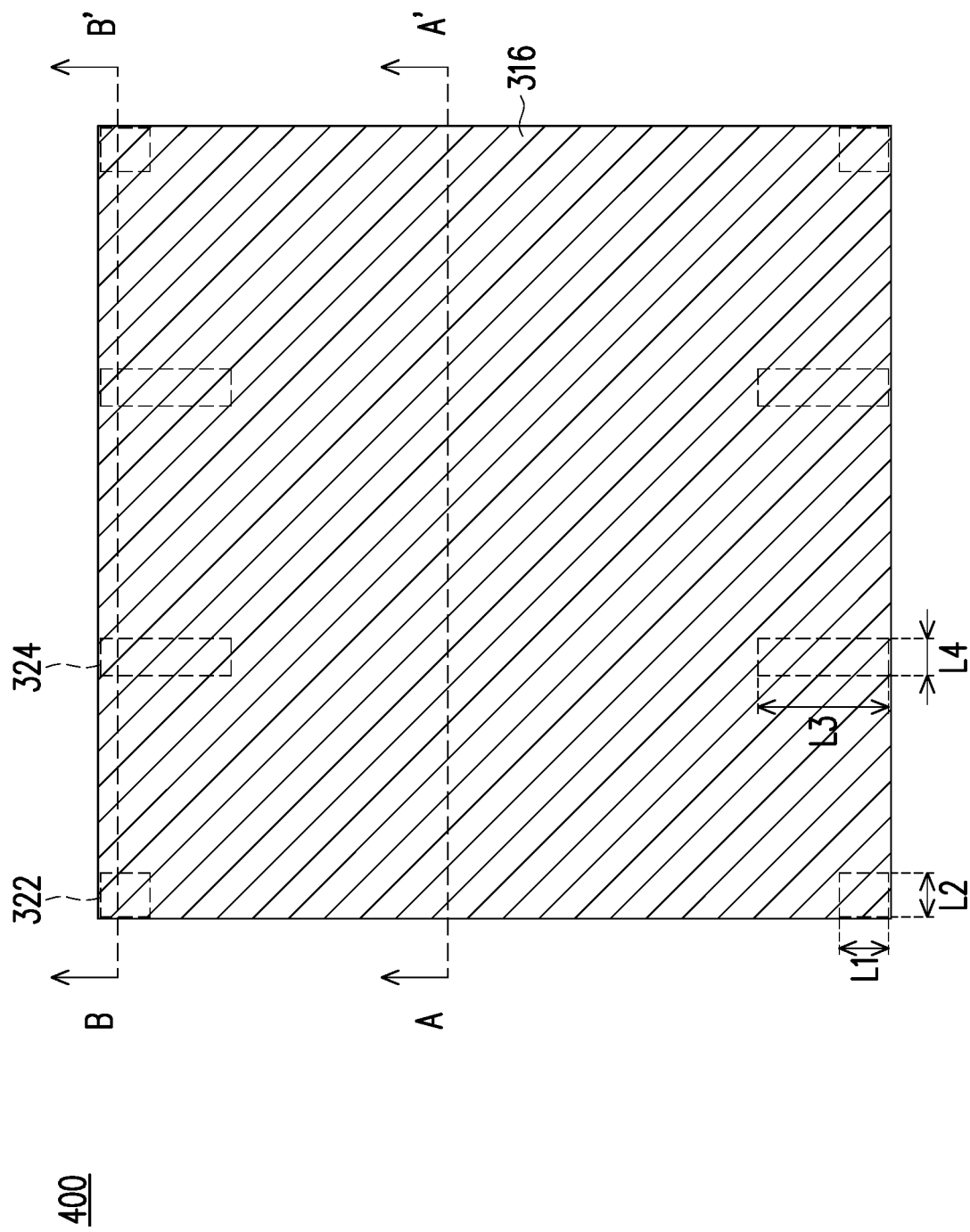

FIGS. 18A and 18B show top views of the package 400 shown FIG. 17 in accordance with some embodiments. The cross-sectional view of the package 400 shown in FIG. 17 may be obtained from the reference cross-section A-A' in FIGS. 18A and 18B, wherein like reference numerals refer to like features. The reference cross-section A-A' may extend through one first package component 100 and two second package components 200 in a direction that is parallel to an outer edge of the package substrate 300. The lid 316, the adhesive 318, and the adhesive 320 are omitted in FIG. 18A for illustrative purposes.

In FIG. 18A, two first package components 100 are disposed in a center region of the package substrate 300, and four second package components 200 are disposed adjacent each outer edge of the package substrate 300. The first package components 100 and the second package components 200 are encircled by the stiffener ring 312. The numbers and arrangements of the first package components 100 and the second package components 200 shown in FIG. 18A are provided as an example. Other numbers and arrangements of the first package components 100 and the second package components 200 are possible.

The stiffener ring 312 may comprise two segments 312A that extend parallel to the reference cross-section A-A'. Portions of the segments 312A of the stiffener ring 312 adjacent the second package components 200 may have a width W1, which may be in a range from about 2 mm to about 10 mm, such as about 4.3 mm. Portions of the segments 312A of the stiffener ring 312 adjacent the first package components 100 may have a width W2, which may be in a range from about 1.8 mm to about 11 mm, such as about 1.8 mm. In some embodiments, the width W1 may be greater than the width W2.

The stiffener ring 312 may comprise two outer segments 312B that extend perpendicular to the reference cross-section A-A' and along the outer edges of the package substrate 300. The outer segments 312B of the stiffener ring 312 may have a width W3, which may be in a range from about 1.8 mm to about 11 mm, such as about 1.8 mm. The stiffener ring 312 may further comprise two inner segments 312C that extend perpendicular to the reference cross-section A-A' and between the first package components 100 and the second package components 200. The inner segments 312C of the stiffener ring 312 may have a width W4, which may be in a range from about 1.8 mm to about 11 mm, such as about 1.8 mm. In some embodiments, the width W1 may be substantially identical to the width W2.

In FIG. 18B, first indents 322 are disposed at the corners of the lid 316. The first indents 322 may be disposed over the corners of the stiffener ring 312, which are the intersections of the two segments 312A and the two outer segments 312B of the stiffener ring 312. FIG. 18B further illustrate second indents 324 of the lid 316, which may be disposed over the intersections of the two segments 312A and the two inner segments 312C of the stiffener ring 312. The first indents 322 and the second indents 324 are disposed on the side of the lid 316 that faces the stiffener ring 312 and are shown in dotted lines in FIG. 18B for illustrative purposes. The first indents 322 may have a length L1 in a range from about 3.9 mm to about 4.7 mm, such as 4.3 mm, and a width L2 in a range from about 3.9 mm to about 4.7 mm, such as about 4.3 mm. In some embodiments, the length L1 may be substantially identical to the width W1. The second indents 324 may have a length L3 in a range from about 2 mm to about 30 mm, such as about 13.5 mm, and a width L4 in a range from about 3.9 mm to about 4.7 mm, such as 4.3 mm. In some embodiments, the width L4 may be substantially identical to the width W4.

Figure 18C:
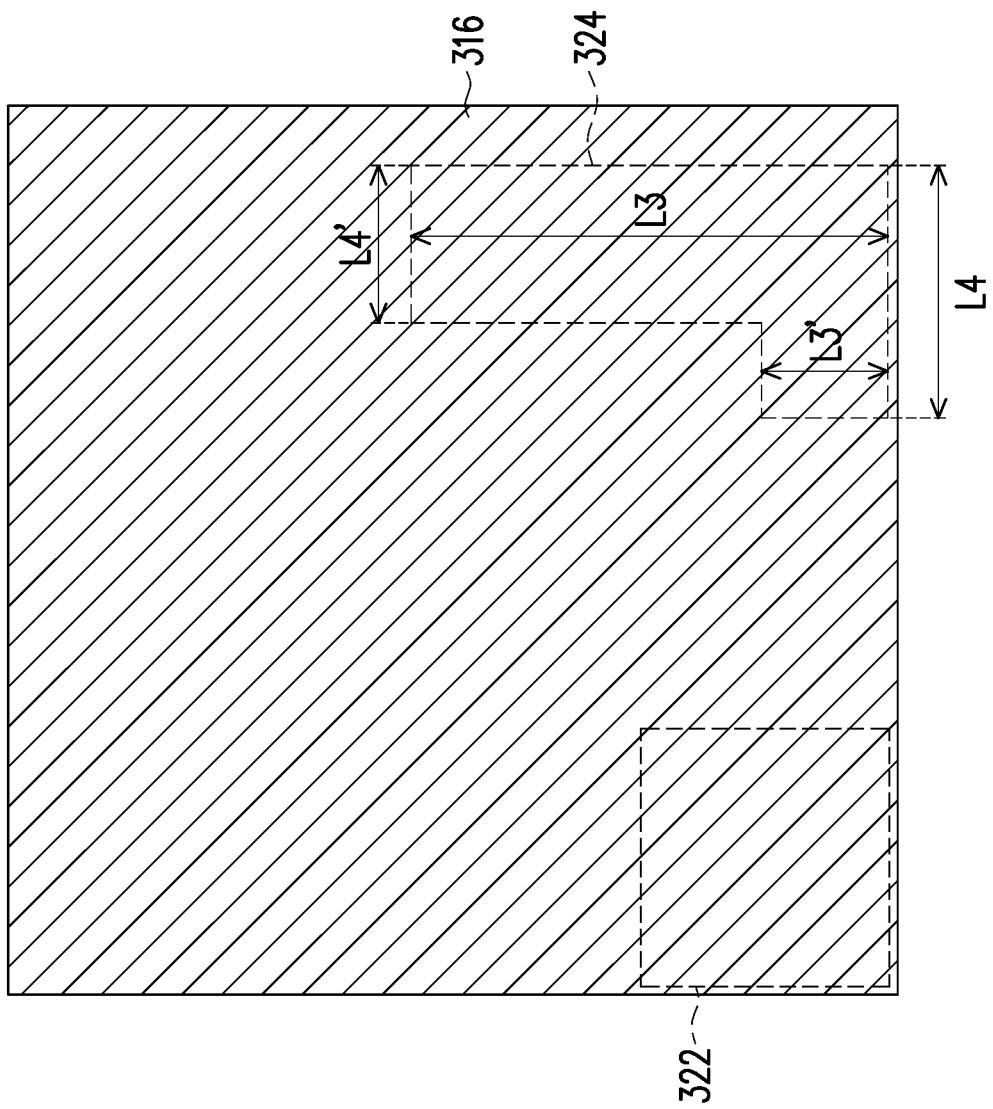

FIG. 18C shows a portion of the structure shown in FIG. 18B, wherein the second indent 324 has a different configuration from the one shown in FIG. 18B in the top view. In some embodiments, the second indent 324 may have an "L" shape in the top view. A longer portion of the second indent 324 may have the length L3 and a shorter portion of the second indent 324 may have a length L3' in a range from about 3.9 mm to about 4.7 mm, such as about 4.3 mm. The shorter portion may be disposed closer to the first indent 322 than the longer portion to the first indent 322. A wider portion of the second indent 324 may have the width L4 and a narrower portion of the second indent 324 may have a width L4' in a range from about 2.4 mm to about 3.6 mm, such as about 3 mm. The wider portion may be disposed closer to an edge of the lid 316 than the narrower portion to edge of the lid 316.

Figure 19A:
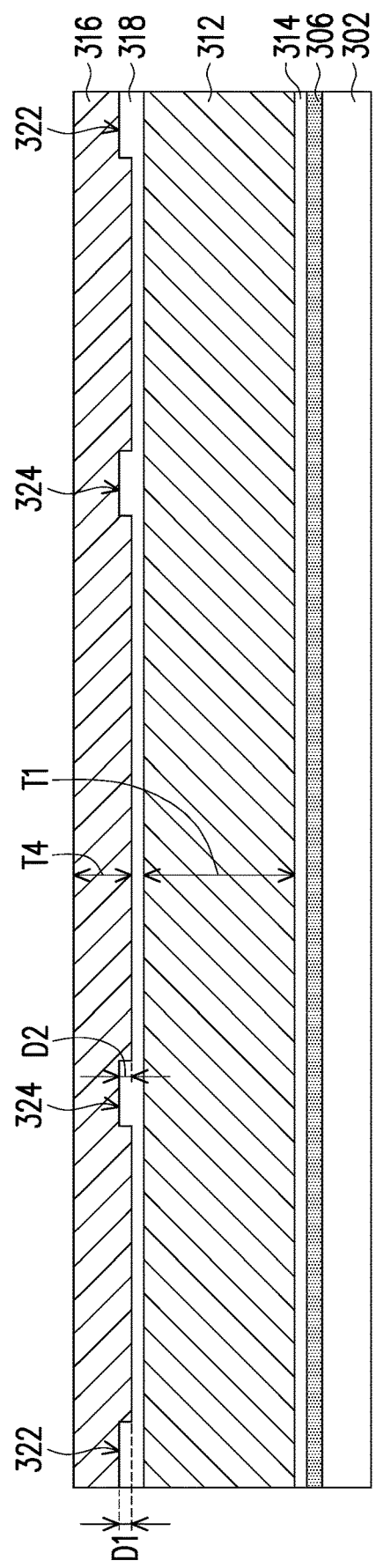

FIG. 19A shows another cross-sectional view of the package 400 shown in FIG. 17, which may be obtained from the reference cross-section B-B' in FIGS. 18A and 18B, wherein like reference numerals refer to like features. The reference cross-section B-B' may extend through the segment 312A of the stiffener ring 312 in a direction that is parallel to the reference cross-section A-A'. As shown in FIG. 19A, the adhesive 318 may fill in the gap between the lid 316 and the stiffener ring 312, including the first indents 322 and the second indents 324, such that the adhesive 318 extends between the lid 316 and the stiffener ring 312. A top surface of the stiffener ring 312 (e.g., the surface facing the lid 316) may be substantially level and free of indent. The first indents 322 may have a depth D1 in a range from about 0.06 mm to about 0.16 mm, such as about 0.1 mm. The second indents 324 may have a depth D2 in a range from about 0.06 mm to about 0.16 mm, such as about 0.1 mm. The first indents 322 and the second indents 324 with depths in such ranges may prevent or reduce the delamination of the adhesive 318 from the lid 316 and the stiffener ring 312 during the usage of the package 400.

Advantages may be achieved by utilizing the lid 316 having the first indents 322 and the second indents 324. First, the first indents 322 and the second indents 324 may decrease the thickness of the lid 316 at select locations, which may mitigate the mismatch of the coefficients of thermal expansion between the lid 316 and the stiffener ring 312. The select locations where the indents are located may correspond to areas where the mismatch of the coefficients of thermal expansion between the lid 316 and the stiffener ring 312 may lead to delamination of the adhesive 318 from the lid 316 and the stiffener ring 312 during the usage of the package 400. Further, the first indents 322 and the second indents 324 may increase the volume of the adhesive 318 between the lid 316 and the stiffener ring 312 at the select locations, which may increase the capacity of the adhesive 318 to absorb the stress that may be caused by the mismatch of the coefficients of thermal expansion between the lid 316 and the stiffener ring 312. Additionally, the first indents 322 and the second indents 324 may increase the overall area of the contact interface between the adhesive 318 and the lid 316 at the select locations, which may improve the ability of the adhesive 318 to adhere to the lid 316. For example, by utilizing the first indents 322 and the second indents 324, the adhesive 318 may contact the lid 316 on both lateral sidewall surfaces. Each of the above factors may prevent or reduce the delamination of the adhesive 318 from the lid 316 and the stiffener ring 312 during the usage of the package 400, thereby improving long-term reliability of the package 400.

Figure 19B:
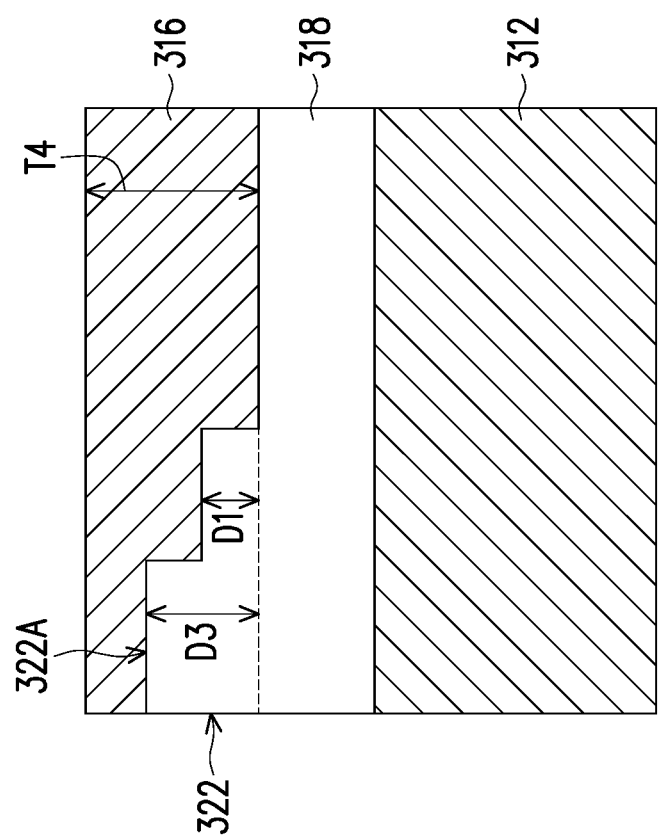

FIG. 19B shows a portion of the package 400 shown FIG. 19A with the first indents 322 of a different configuration, wherein each first indent 322 may have varied depths. For example, each first indent 322 has a corner portion 322A of a different thickness than the rest of the first indent 322. As shown in FIG. 19B, the corner portion 322A of the first indent 322 is disposed along the vertical edges of the lid 316 and the stiffener ring 312, and has a depth D3 in a range from about 0.1 mm to about 0.2 mm, such as 0.14 mm. In some embodiments, the depth D3 may be larger than the depth D1. The first indents 322 with depths in such ranges may prevent or reduce the delamination of the adhesive 318 from the lid 316 and the stiffener ring 312 during the usage of the package 400.

Figure 19C:
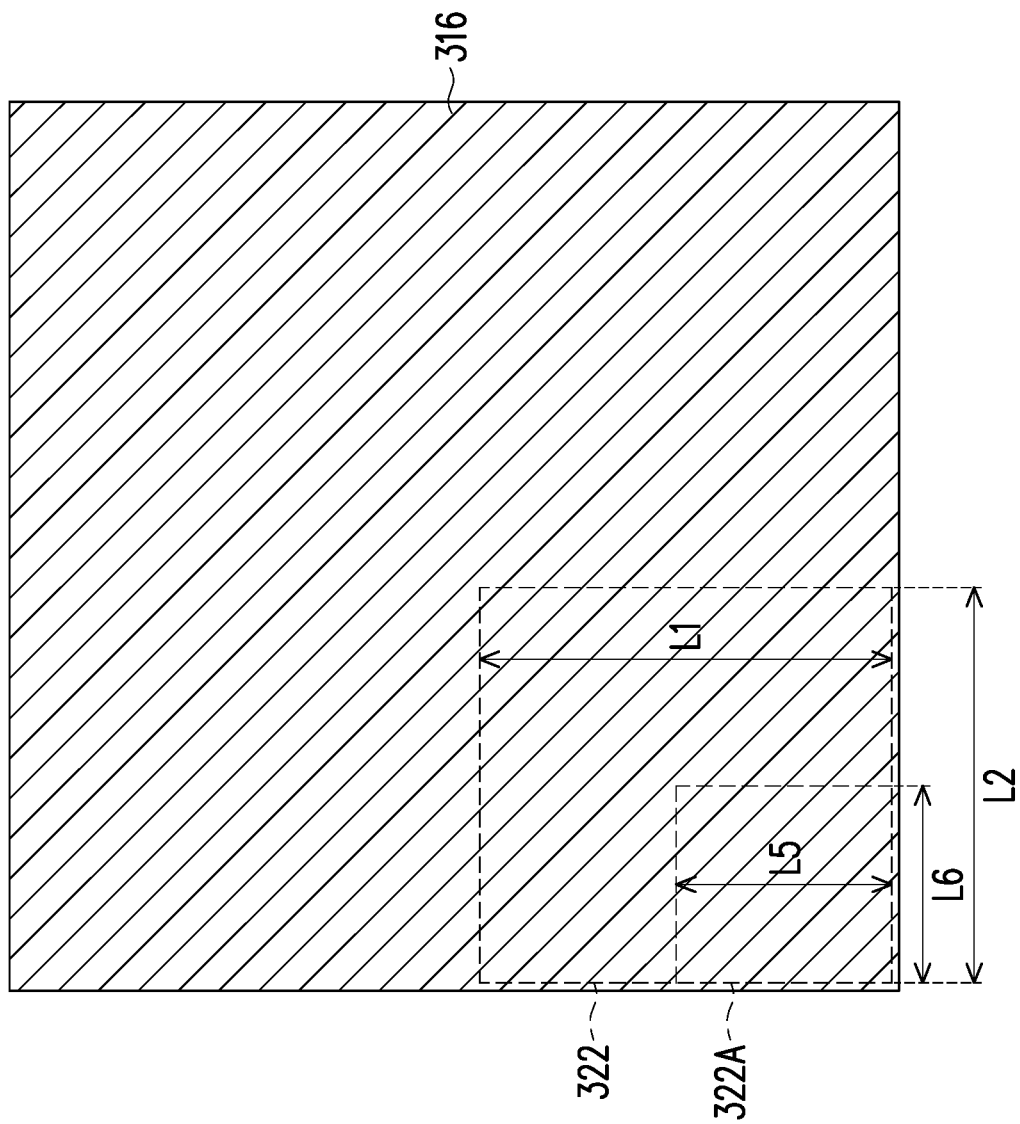

FIG. 19C shows a top view of the portion of the package 400 shown FIG. 19B, wherein the corner portion 322A of the first indent 322 is disposed at the corner of the lid 316. The corner portion 322A of the first indent 322 may have a length L5 in a range from about 1.8 mm to about 2.2 mm, such as about 2 mm, and a width L6 in a range from about 1.8 mm to about 2.2 mm, such as about 2 mm. In some embodiments, the length L5 may be smaller than the length L1 and the width L6 may be smaller than the width L2.

Figure 20:
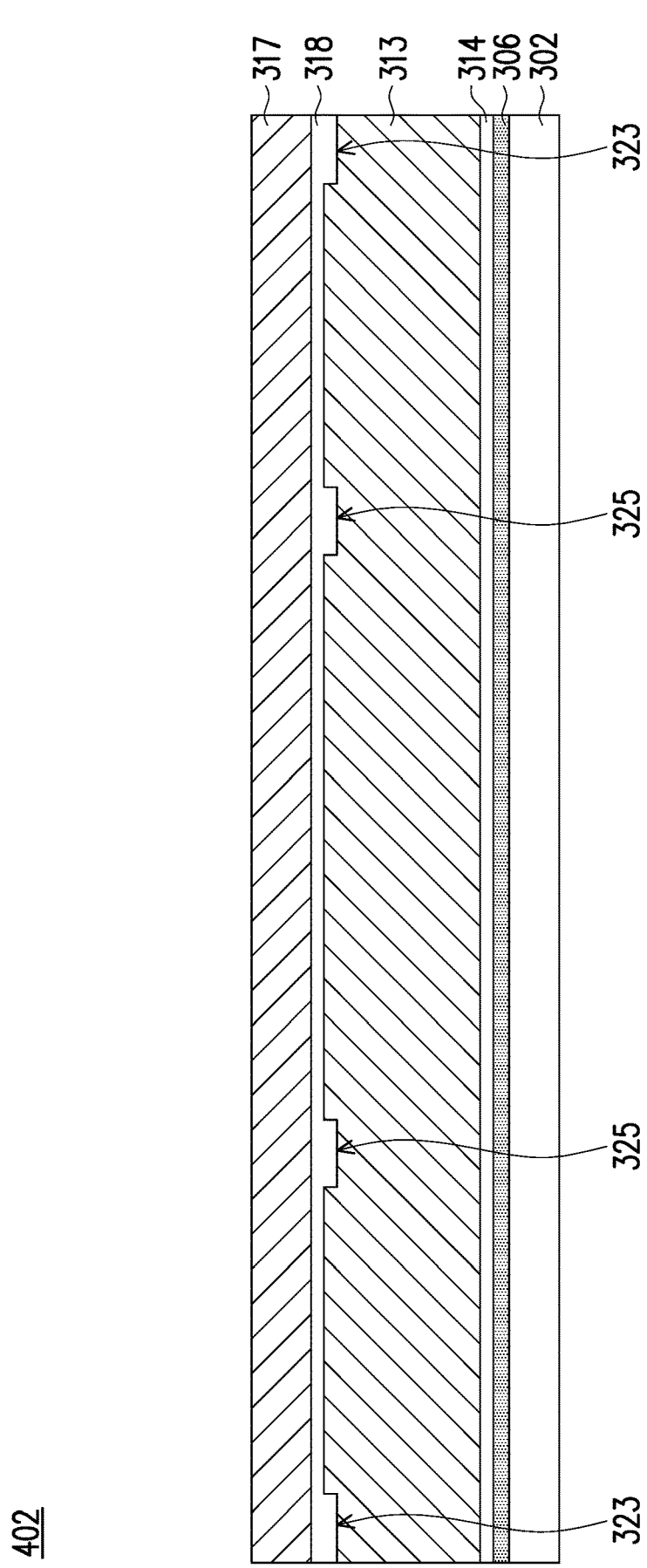

FIG. 20 shows a package 402 similar to the package 400 shown FIG. 19A in accordance with some embodiments, wherein like reference numerals refer to like features. In FIG. 20, third indents 323 and fourth indents 325 are disposed in a stiffener ring 313, and a lid 317 is attached to the stiffener ring 313 by the adhesive 318. The adhesive 318 may fill in the gap between the lid 317 and the stiffener ring 313, including the third indents 323 and the fourth indents 325, such that the adhesive 318 extends between the lid 317 and the stiffener ring 313. A bottom surface of the lid 317 (e.g., the surface facing the stiffener ring 313) may be substantially level and free of indents. The composition, shape, and dimensions of the stiffener ring 313 may be substantially identical to the composition, shape, and dimensions of the stiffener ring 312, other than the presence of the third indents 323 and the fourth indents 325. The composition, shape, and dimensions of the lid 317 may be substantially identical to the composition, shape, and dimensions of the lid 316, other than the omission of the first indents 322 and the second indents 324. The dimensions of the third indents 323 and the fourth indents 325 may be substantially identical to the dimensions of the first indents 322 and the second indents 324, respectively. The locations of the third indents 323 and the fourth indents 325 in the top view may be substantially identical to the locations of the first indents 322 and the second indents 324, respectively, shown in FIG. 18B.

Figure 21:
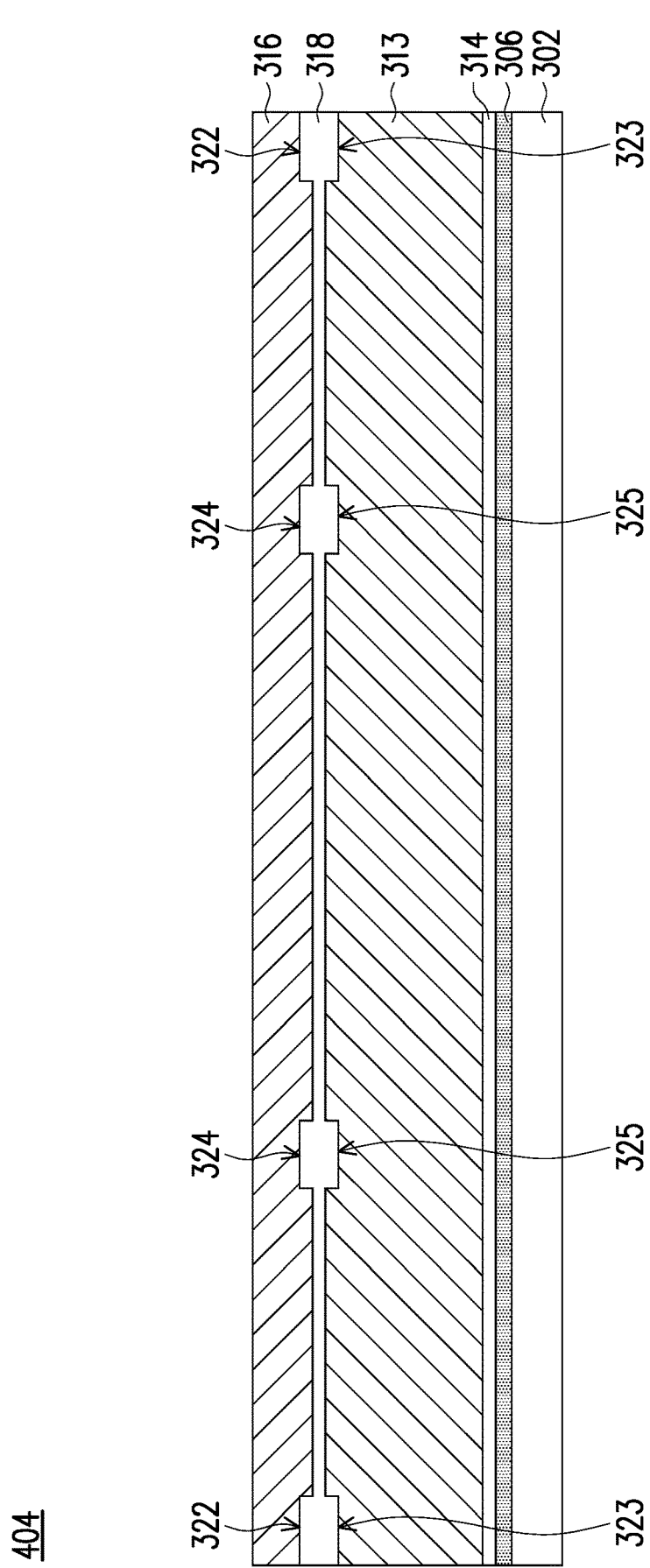

FIG. 21 shows a package 404 similar to the package 400 shown FIG. 19A in accordance with some embodiments, wherein like reference numerals refer to like features. In FIG. 21, the first indents 322 and the second indents 324 are disposed in the lid 316, the third indents 323 and the fourth indents 325 are disposed in the stiffener ring 313 facing the first indents 322 and the second indents 324, respectively, and the lid 316 is attached to the stiffener ring 313 by the adhesive 318. The adhesive 318 may fill in the gap between the lid 316 and the stiffener ring 313, including the first indents 322, the second indents 324, the third indents 323, and the fourth indents 325, such that the adhesive 318 extends between the lid 316 and the stiffener ring 313.

In some embodiments, first indents 322 and the third indents 323 shown in FIGS. 20 and 21 may also have corner portions similar to the corner portions 322A of the first indent 322 discussed above with respect to FIGS. 19B and 19C. The locations of the corner portions of the first indent 322 and the third indents 323 in the top view may be substantially identical to the locations of the corner portions 322A of the first indent 322 shown in FIG. 19C.

FIGS. 22 to 28 illustrate manufacturing processes of packages similar to the package 400 shown FIG. 17 in accordance with some embodiments, wherein like reference numerals indicate like elements formed using like processes as described above with respect to FIGS. 1 through 21 unless otherwise noted. As discussed in greater details below, FIGS. 22 to 28 illustrate stiffener rings with various indents as well as lids with protrusions that are attached to the stiffener rings by adhesives, which may prevent or reduce delamination of the adhesives from the stiffener rings and the lids during the usage of the packages.

Figure 22:
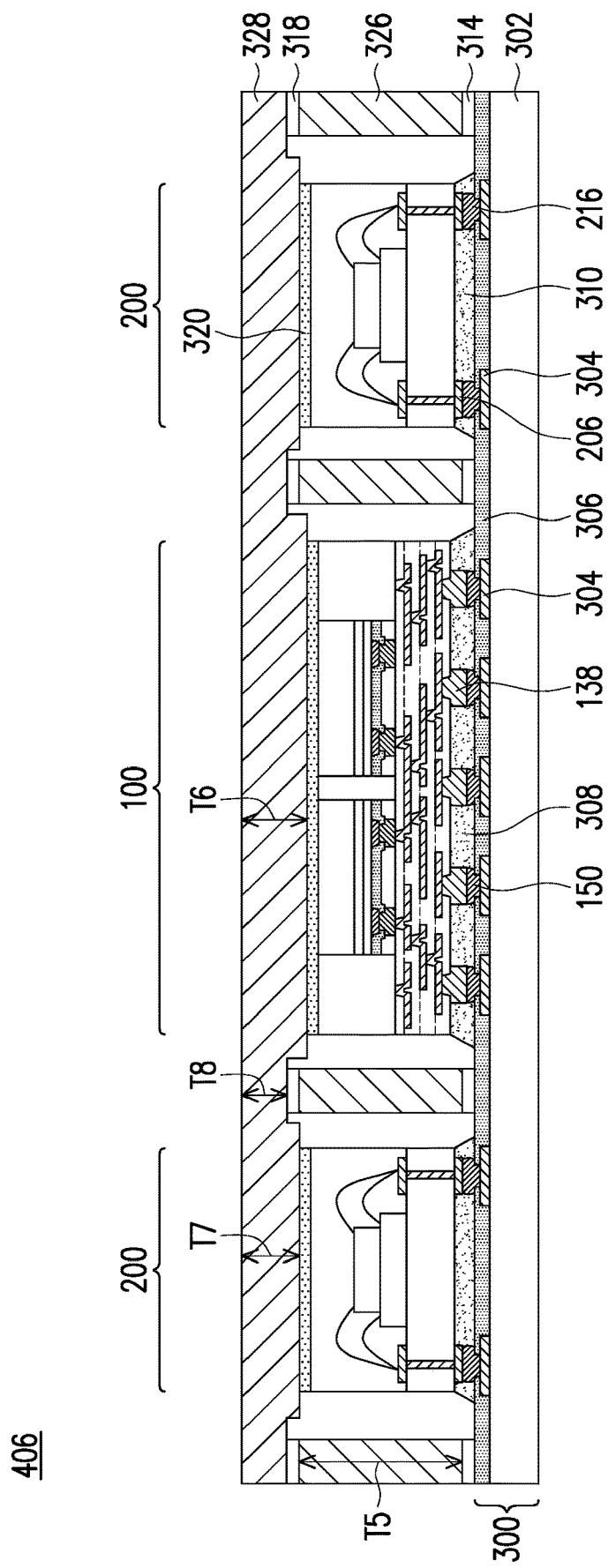

FIG. 22 shows a package 406 similar to the package 400 shown FIG. 17 in accordance with some embodiments, wherein like reference numerals refer to like features. A stiffener ring 326 is attached on the package substrate 300 by the adhesive 314 and a lid 328 is attached on the stiffener ring 326 by the adhesive 318. The stiffener ring 326 and the lid 328 may comprise the same or similar materials and may have the same or similar functions as the stiffener ring 312 and the lid 316, respectively, discussed above with respect to FIG. 16. Coefficient of thermal expansion α4 of the stiffener ring 326 may be substantially identical to the thermal expansion α2 of the stiffener ring 312, which may be in a range from about $2 \times 10^{-6 \circ}$ C.$^{-1}$ to about $12 \times 10^{-6 \circ}$ C.$^{-1}$, such as $3.9 \times 10^{-6 \circ}$ C. In some embodiments, the stiffener ring 326 with the coefficient of thermal expansion α4 in the range from about $2 \times 10^{-6 \circ}$ C.$^{-1}$ to about $12 \times 10^{-6 \circ}$ C.$^{-1}$ may improve the reliability of the encapsulant 120 and the front-side redistribution structure 122 of the first package components 100 during operation. Coefficient of thermal expansion α5 of the lid 328 may be substantially identical to the thermal expansion α3 of the lid 316, which may be in a range from about $14 \times 10^{-6 \circ}$ C.$^{-1}$ to about $18 \times 10^{-6 \circ}$ C.$^{-1}$, such as $16 \times 10^{-6 \circ}$ C.$^{-1}$. Thickness T5 of the stiffener ring 326 may be substantially identical to the thickness T1 of the stiffener ring 312 discussed above with respect to FIG. 16. Thickness T6, thickness T7, and thickness T8 of the lid 328 may be substantially identical to the thickness T2, thickness T3, and thickness T4 of the lid 328, respectively, discussed above with respect to FIG. 17.

Figure 23A:
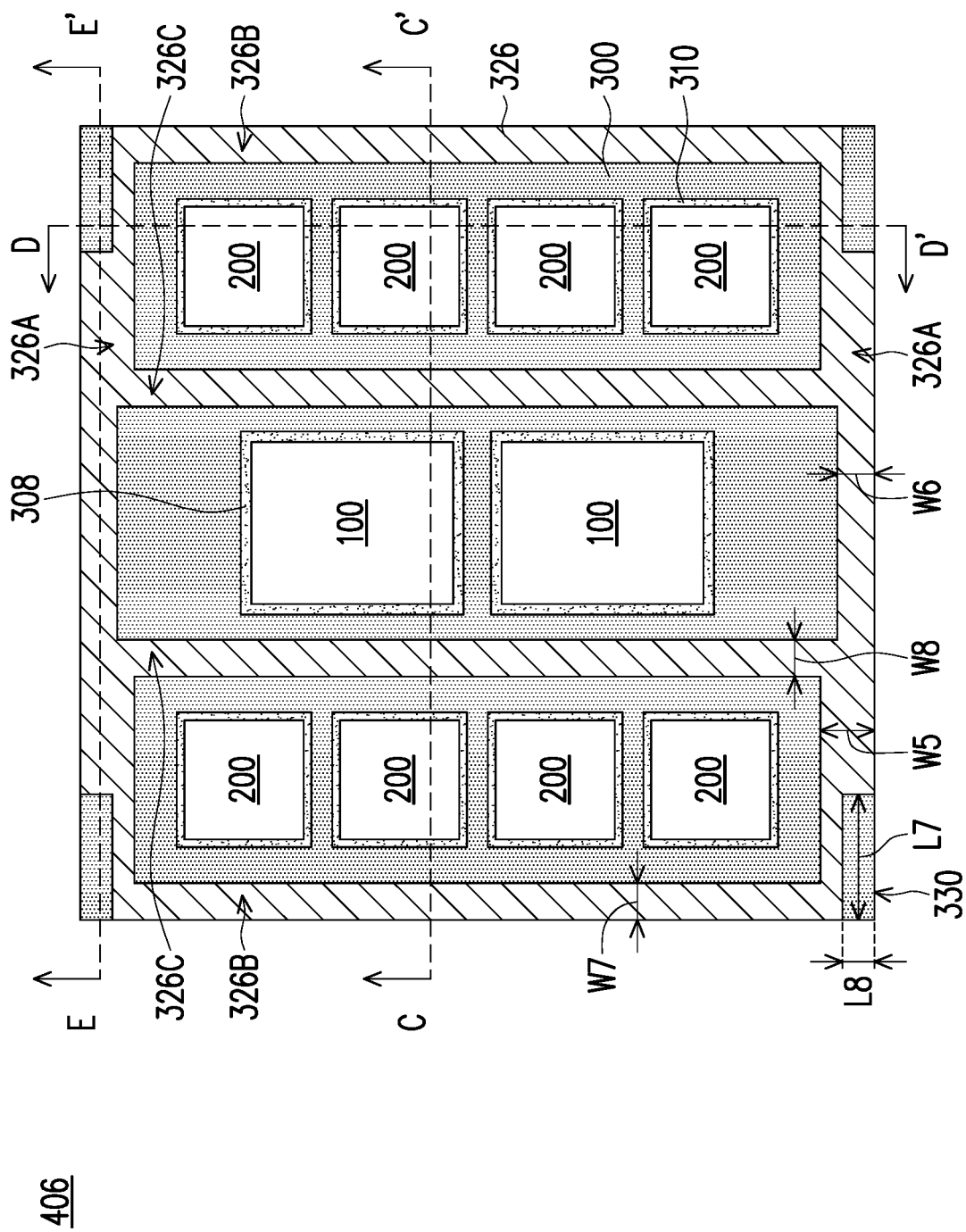
Figure 23B:
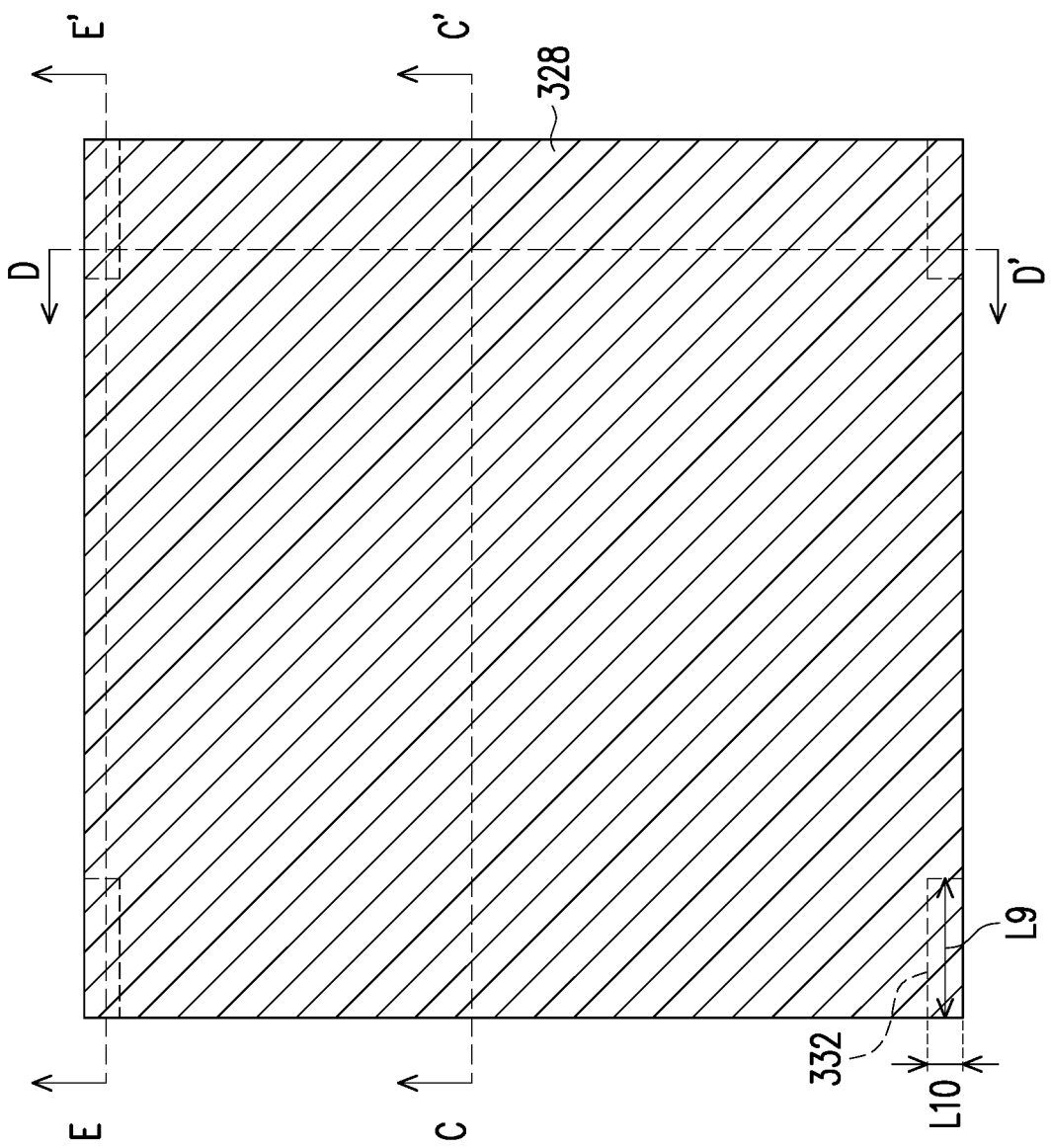

FIGS. 23A and 23B show top views of the package 406 shown FIG. 22 in accordance with some embodiments. The cross-sectional view of the package 406 shown in FIG. 22 may be obtained from the reference cross-section C-C' in FIGS. 23A and 23B, wherein like reference numerals refer to like features. The reference cross-section C-C' may extend through one first package component 100 and two second package components 200 in a direction that is parallel to an outer edge of the package substrate 300. The lid 328, the adhesive 318, and the adhesive 320 are omitted in FIG. 18A for illustrative purposes.

In FIG. 23A, the locations and arrangements of the first package components 100, second package components 200, and the stiffener ring 326 on the package substrate 300 may be similar or the same as the locations and arrangements of the first package components 100, second package components 200, and the stiffener ring 312 on the package substrate 300 discussed above with respect to FIG. 18A.

The stiffener ring 326 comprises two segments 326A, two outer segments 326B, and two inner segments 326C, which may be similar or the same as the two segments 312A, the two outer segments 312B, and the two inner segments 312C of the stiffener ring 312, respectively, discussed above with respect to FIG. 18A. Width W5, width W6, width W7, and width W8 of the stiffener ring 326 may be substantially identical to the width W1, the width W2, the width W3, and the width W4 of the stiffener ring 312, respectively, discussed above with respect to FIG. 18A.

In FIG. 23A, fifth indents 330 are disposed at the corners of the stiffener ring 326, which are the intersections of the two segments 326A and the two outer segments 326B of the stiffener ring 326. The fifth indents 330 may extend completely through the stiffener ring 326. The fifth indents 330 may have a length L7 in a range from about 2 mm to about 20 mm, such as about 10 mm, and a width L8 in a range from about 1 mm to about 9 mm, such as about 2.3 mm.

In FIG. 23B, protrusions 332 are disposed at the corners of the lid 328. Each protrusion 332 may extend into a corresponding fifth indent 330. The protrusions 332 are disposed on the side of the lid 328 that faces the stiffener ring 326 and are shown in dotted lines in FIG. 23B for illustrative purposes. The protrusions 332 may have a length L9 and a width L10, which may be similar to but slightly smaller than the length L7 and the width L8, respectively, discussed with respect to FIG. 23A.

Figure 24:
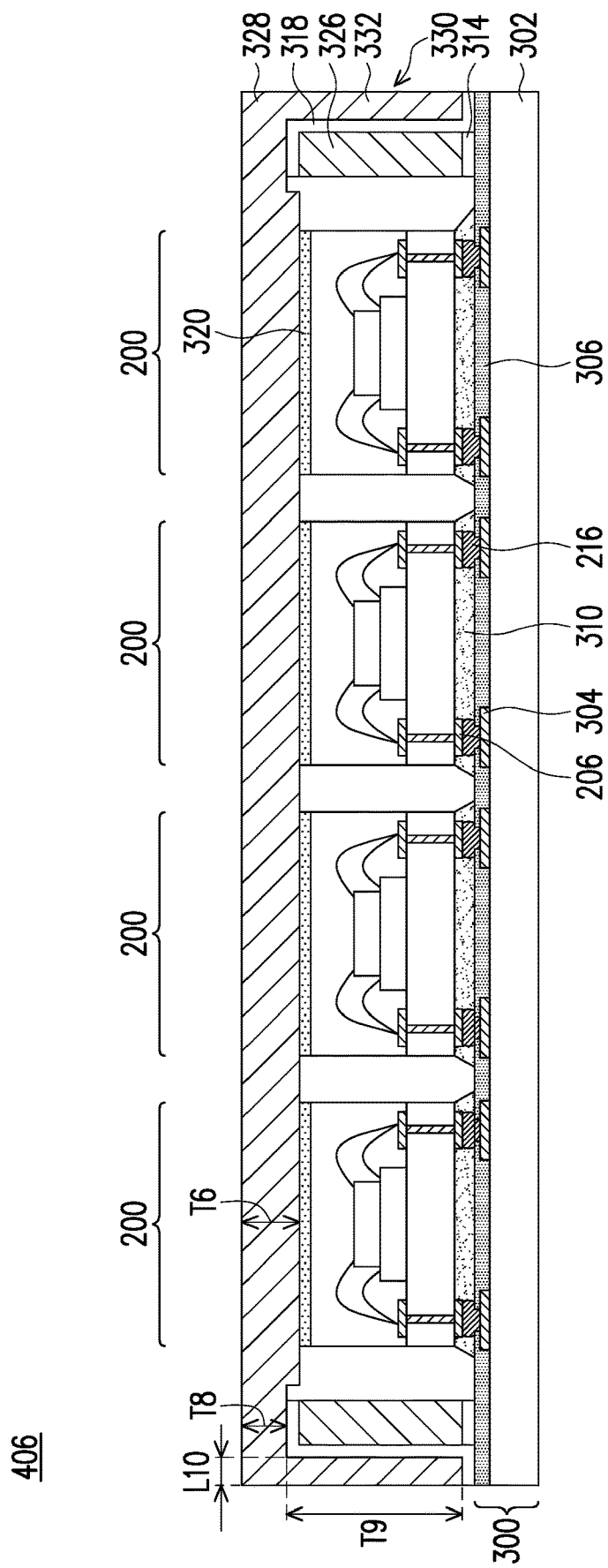

FIG. 24 shows another cross-sectional view of the package 406 shown in FIG. 22, which may be obtained from the reference cross-section D-D' in FIGS. 23A and 23B, wherein like reference numerals refer to like features. The reference cross-section D-D' may extend through four second package components 200 in a direction that is perpendicular to the reference cross-section C-C'. As shown in FIG. 24, the protrusions 332 may extend into the fifth indents 330, wherein bottom surfaces of the protrusions 332 may be attached to the package substrate 300 by the adhesive 318 and first inner sidewalls of the protrusions 332 may be attached to the stiffener ring 326 by the adhesive 318. The width L10 may extend from the first inner sidewalls to first outer sidewalls of the protrusions 332. The protrusions 332 may have a thickness T9, in a range from about 1.1 mm to about 3.8 mm, such as about 1.3 mm. In some embodiments, the difference between the coefficient of thermal expansion α5 of the lid 328 and the coefficient of thermal expansion α1 of the package substrate 300 is smaller than the difference between the coefficient of thermal expansion α4 of the stiffener ring 326 and the coefficient of thermal expansion α1 of the package substrate 300. As a result, the coefficient of thermal expansion α1 of package substrate 300 may be more closely matched by the coefficient of thermal expansion α5 of the lid 328 than the coefficient of thermal expansion α4 of the stiffener ring 326.

Figure 25:
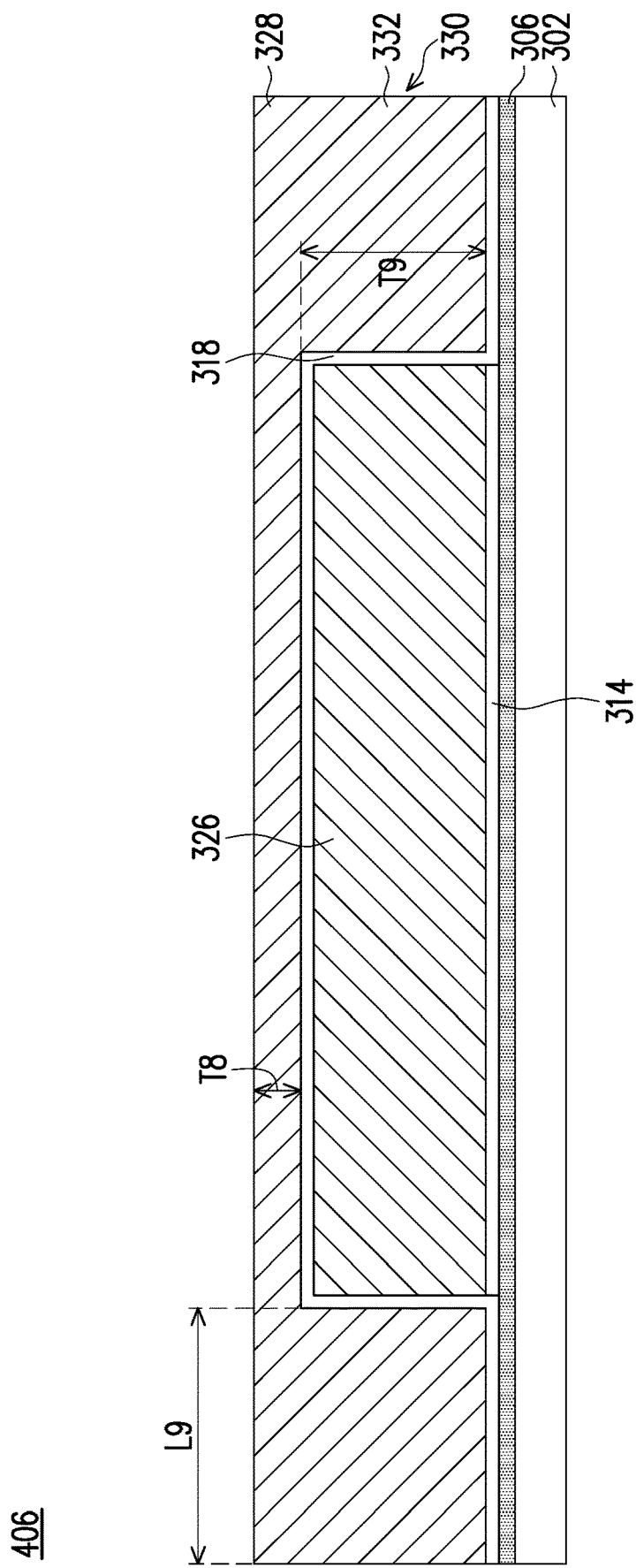

FIG. 25 shows another cross-sectional view of the package 406 shown in FIG. 22, which may be obtained from the reference cross-section E-E' in FIGS. 23A and 23B, wherein like reference numerals refer to like features. The reference cross-section E-E' may extend through the segment 326A of the stiffener ring 326 in a direction that is parallel to the reference cross-section C-C'. As shown in FIG. 25, the protrusions 332 may extend into the fifth indents 330, wherein bottom the surfaces of the protrusions 332 may be attached to the package substrate 300 by the adhesive 318 and second inner sidewalls of the protrusions 332 may be attached to the stiffener ring 326 by the adhesive 318. The adhesive 318 may fill in the gap between the lid 328 and the stiffener ring 326. The length L9 may extend from the second inner sidewalls to second outer sidewalls of the protrusions 332.

Advantages may be achieved by utilizing the stiffener ring 326 having the fifth indents 330 and the lid 328 having the protrusions 332. First, the fifth indents 330 and the protrusions 332 may eliminate the lid 328 at the select locations, which may eliminate the mismatch of the coefficients of thermal expansion between the lid 328 and the stiffener ring 326 at the select locations. The select locations where the indents are located may correspond to areas where the mismatch of the coefficients of thermal expansion between the lid 328 and the stiffener ring 326 may lead to delamination of the adhesive 318 from the lid 328 and the stiffener ring 326 during the usage of the package 400. Additionally, the fifth indents 330 and the protrusions 332 may increase the area of the contact interface between the adhesive 318 and the lid 328. Each of the above factors may prevent or reduce the delamination of the adhesive 318 from the lid 328 and the stiffener ring 326 during the usage of the package 400, thereby improving long-term reliability of the package 400.

Figure 26:
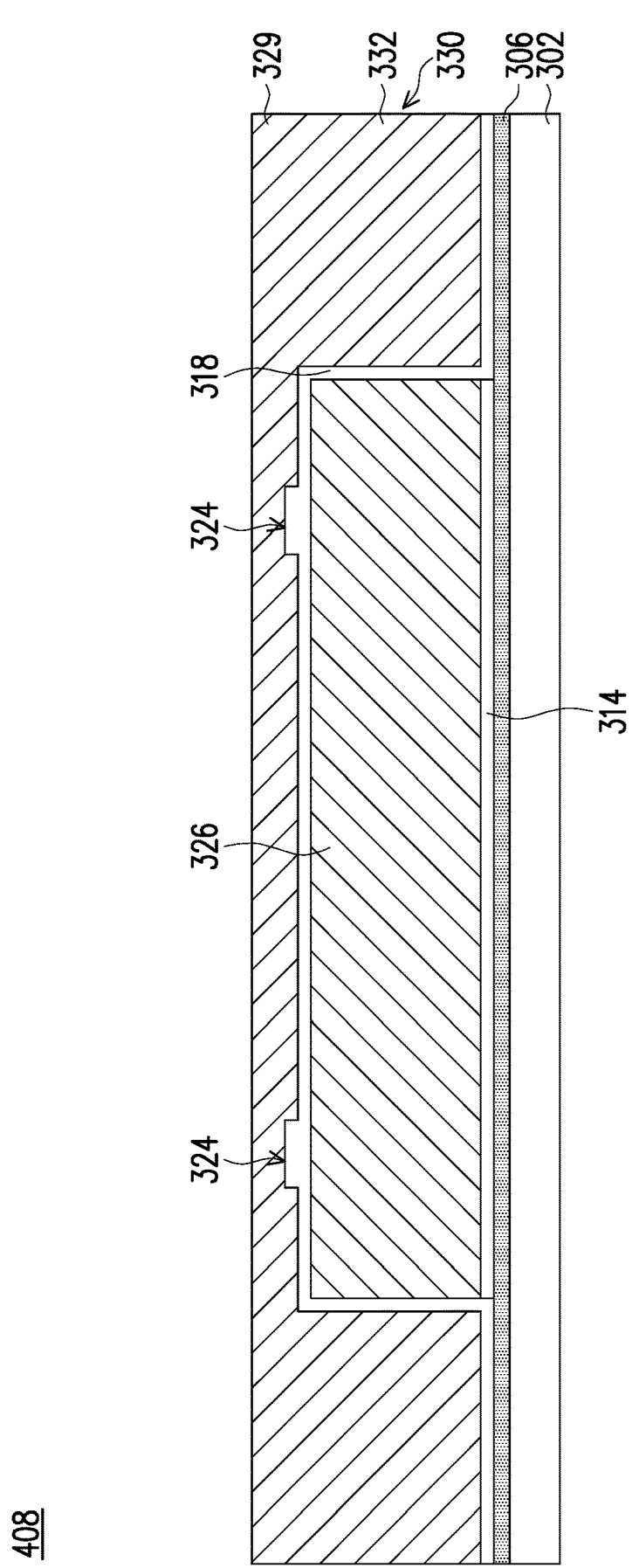

FIG. 26 shows a package 408 similar to the package 406 shown FIG. 25 in accordance with some embodiments, wherein like reference numerals refer to like features. In FIG. 26, the second indents 324 are disposed in a lid 329, and the lid 329 is attached to the stiffener ring 326 by the adhesive 318. The adhesive 318 may fill in the gap between the lid 329 and the stiffener ring 326, including the second indents 324, such that the adhesive 318 extend between the lid 329 and the stiffener ring 326. A top surface of the stiffener ring 326 (e.g., the surface facing the lid 329) may be substantially level and free of indent. The composition, shape, and dimensions of the lid 329 may be substantially identical to the composition, shape, and dimensions of the lid 328, other than the presence of second indents 324. The second indents 324 may further prevent or reduce delamination of the adhesive 318 from the lid 329 and the stiffener ring 326 during the usage of the package 400.

Figure 27:
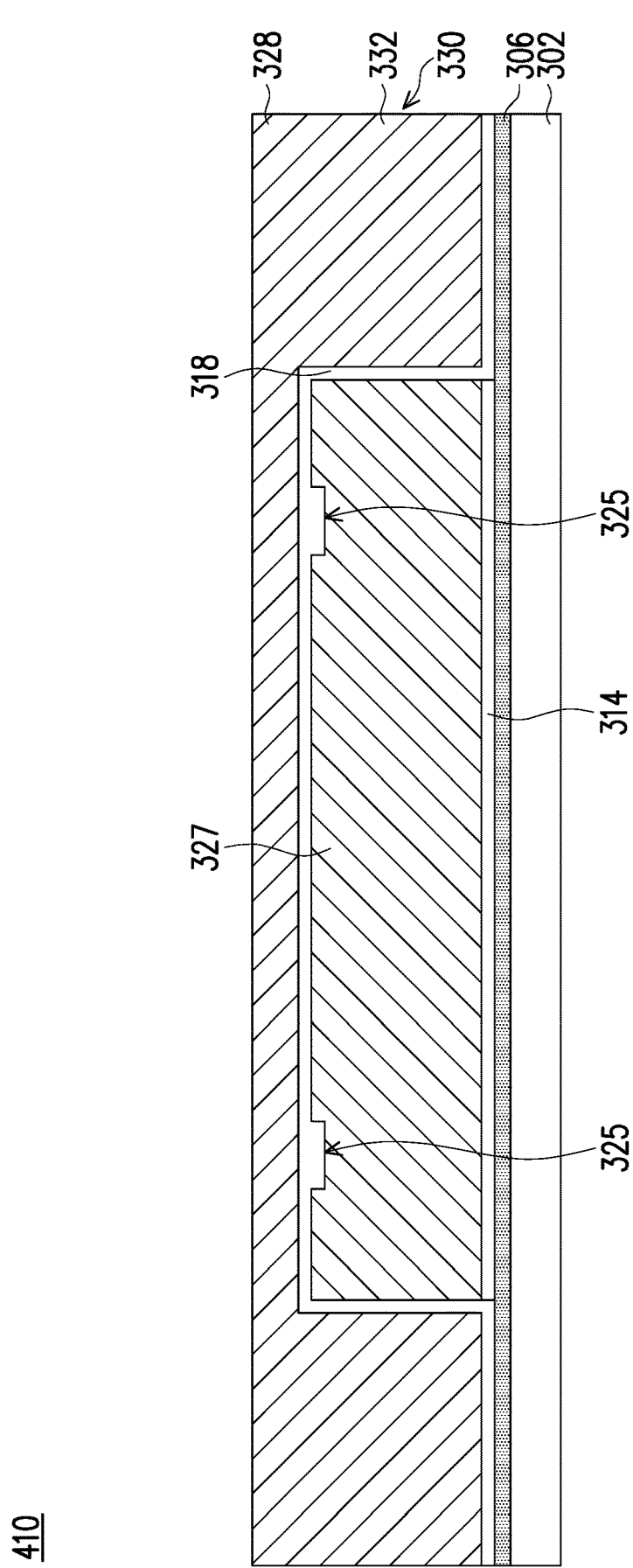

FIG. 27 shows a package 410 similar to the package 408 shown FIG. 26 in accordance with some embodiments, wherein like reference numerals refer to like features. In FIG. 27, the fourth indents 325 are disposed in a stiffener ring 327, and the lid 328 is attached to the stiffener ring 327 by the adhesive 318. The adhesive 318 may fill in the gap between the lid 328 and the stiffener ring 327, including the fourth indents 325, such that the adhesive 318 extends between the lid 328 and the stiffener ring 327. A bottom surface of the lid 328 (e.g., the surface facing the stiffener ring 327) may be substantially level and free of indent. The composition, shape, and dimensions of the stiffener ring 327 may be substantially identical to the composition, shape, and dimensions of the stiffener ring 326, other than the presence of fourth indents 325. The fourth indents 325 may further prevent or reduce delamination of the adhesive 318 from the lid 328 and the stiffener ring 327 during the usage of the package 400.

Figure 28:
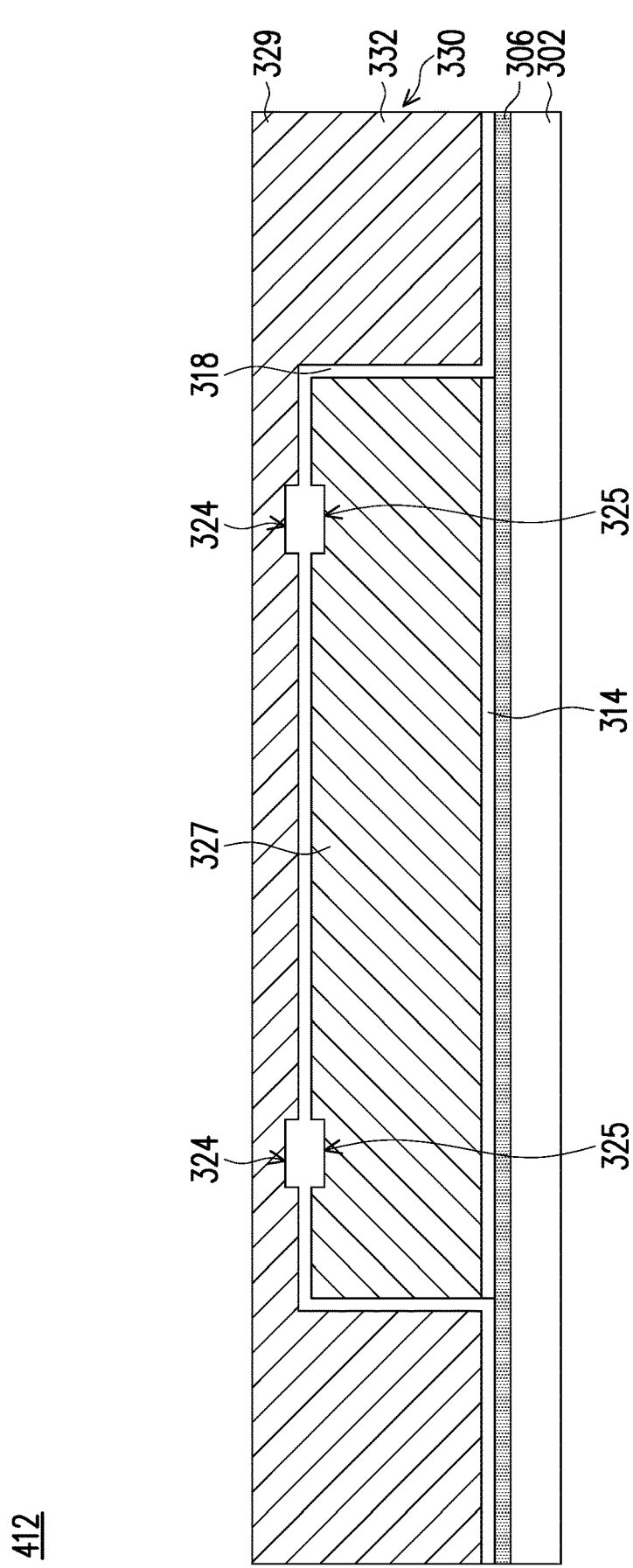

FIG. 28 shows a package 412 similar to the package 408 shown FIG. 26 in accordance with some embodiments, wherein like reference numerals refer to like features. In FIG. 28, the second indents 324 are disposed in the lid 329, the fourth indents 325 are disposed in the stiffener ring 27 facing the second indents 324, and the lid 329 is attached to the stiffener ring 327 by the adhesive 318. The adhesive 318 may fill in the gap between the lid 329 and the stiffener ring 327, including the second indents 324 and the fourth indents 325, such that the adhesive 318 extends between the lid 329 and the stiffener ring 327. The second indents 324 and the fourth indents 325 may further prevent or reduce delamination of the adhesive 318 from the lid 329 and the stiffener ring 327 during the usage of the package 400.

Figure 30A:
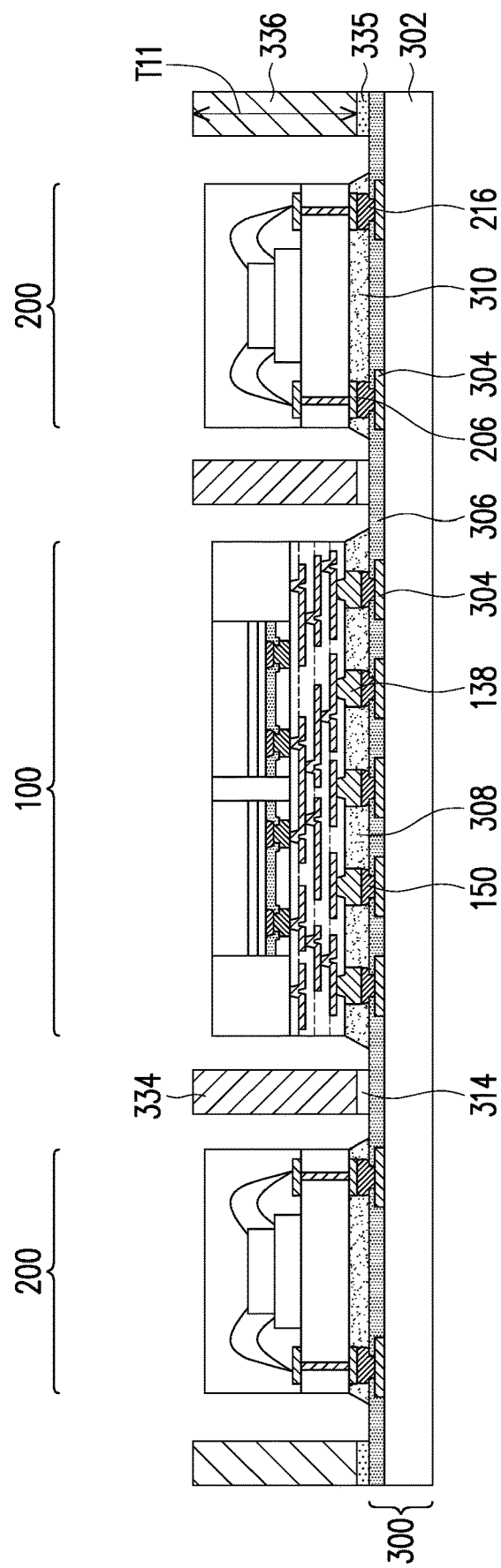
Figure 30B:
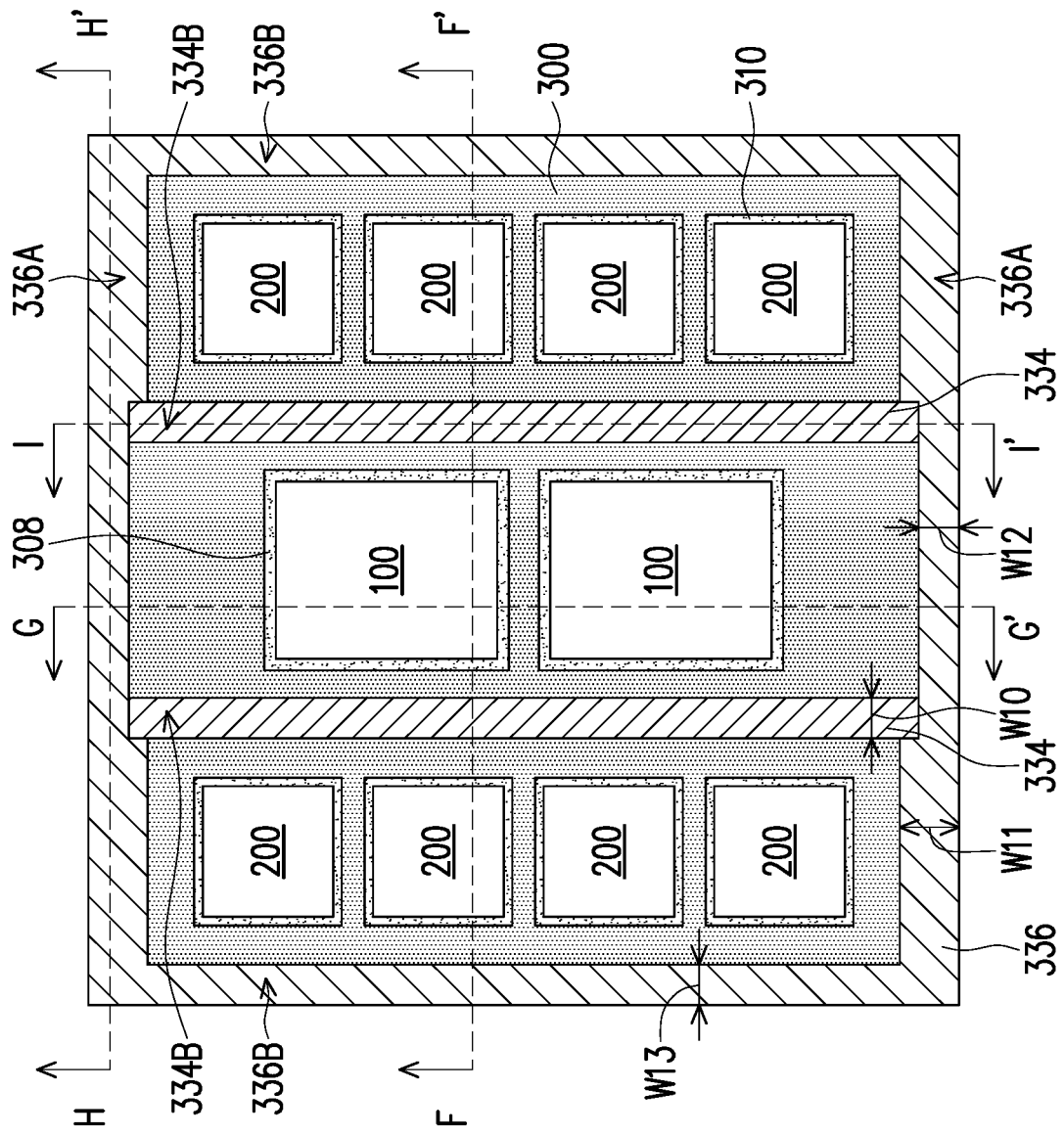
Figure 31A:
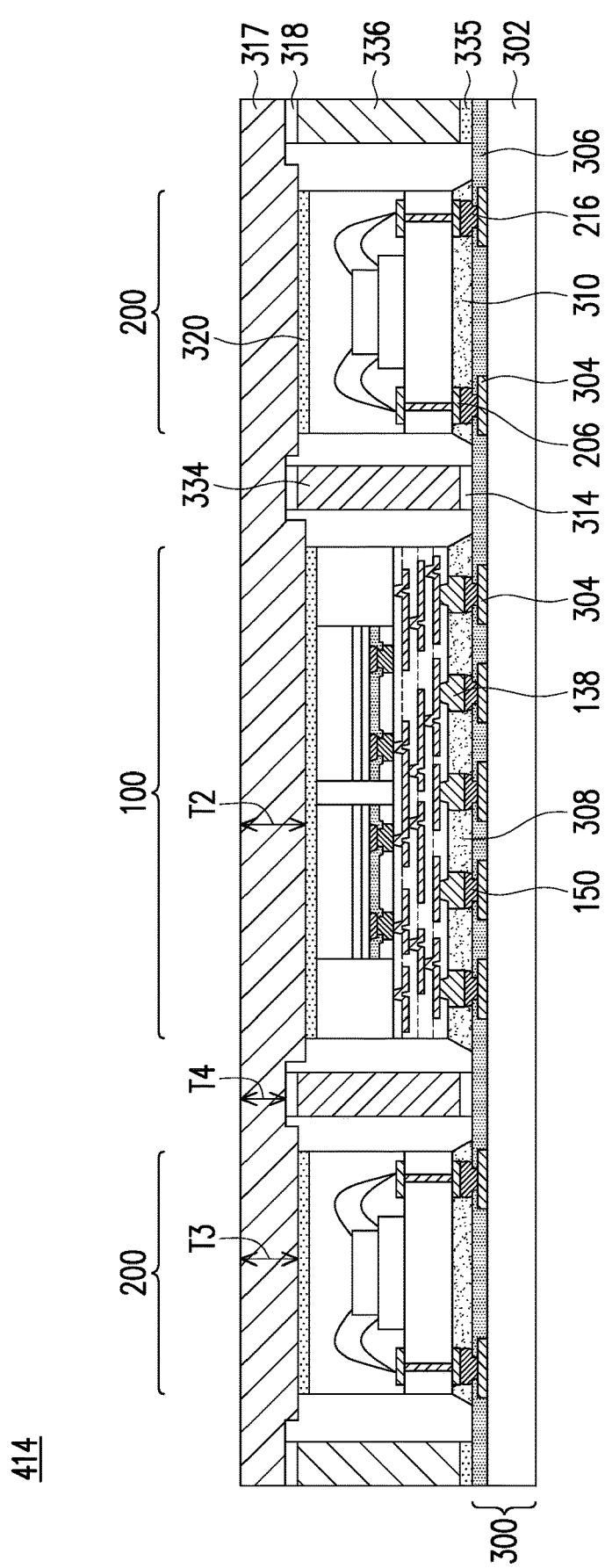

FIGS. 29A to 31D illustrate manufacturing processes of a package 414, as shown in FIG. 31A, which is similar to the package 400 shown FIG. 17, in accordance with some embodiments, wherein like reference numerals indicate like elements formed using like processes as described above with respect to FIGS. 1 through 21 unless otherwise noted. As discussed in greater details below, FIGS. 29A to 31D illustrate a combination of an inner stiffener ring and an outer stiffener ring with different coefficients of thermal expansion and a lid attached to the inner stiffener ring and the outer stiffener ring by an adhesive. The outer stiffener ring may have a coefficient of thermal expansion closer in value to a coefficient of thermal expansion of the lid than a coefficient of thermal expansion of the inner stiffener ring is to the coefficient of thermal expansion of the lid, which may prevent or reduce delamination of the adhesive from the two stiffener rings and the lid during the usage of the package 414.

Figure 29A:
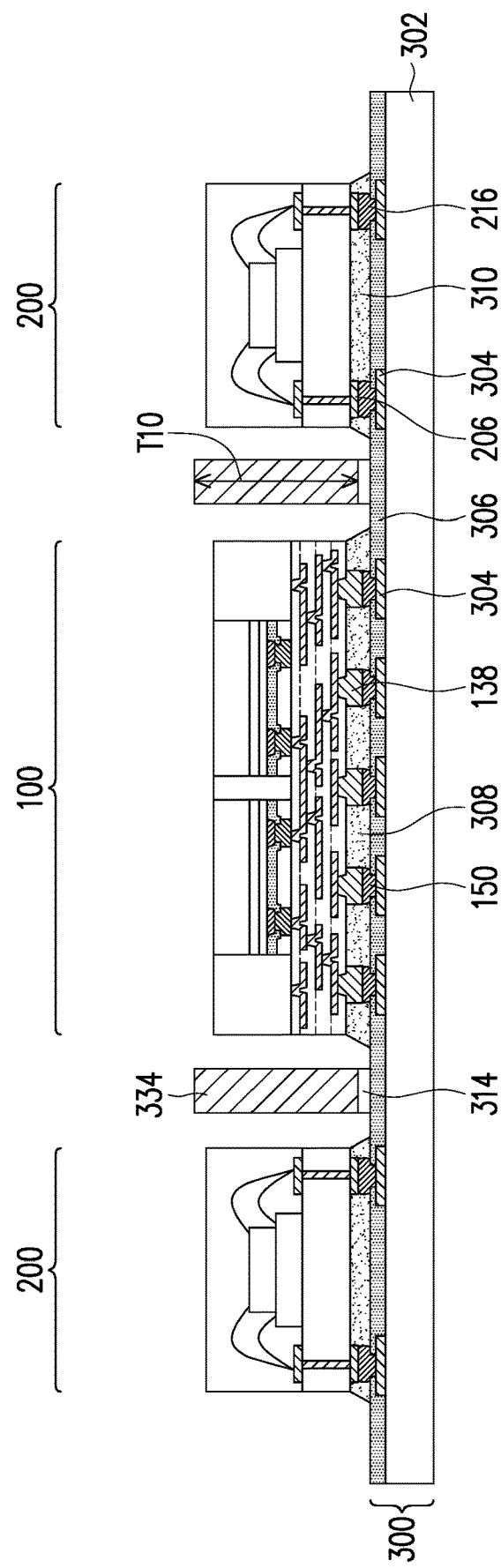

In FIG. 29A, an inner stiffener ring 334 is attached to the package substrate 300 of the structure shown in FIG. 15 utilizing the adhesive 314. The process illustrated in FIG. 29A assumes processes similar to those discussed above with reference to FIGS. 1-15 were previously performed. The inner stiffener ring 334 may be used to provide additional support to the package substrate 300 during subsequent manufacturing processes and usage to reduce warpage or other types of deformation of the package substrate 300. As discussed in greater details below, the inner stiffener ring 334 may encircle the first package components 100 as well as have segments that extend between the first package components 100 and the second package components 200. The inner stiffener ring 334 may be placed so that the inner stiffener ring 334 is laterally separated from the first package components 100, the second package components 200, the underfill 308 and the underfill 310.

The inner stiffener ring 334 may have a coefficient of thermal expansion α6, which may be in a range from about $2\times10^{-6}$ °C.$^{-1}$ to about $6\times10^{-6}$ °C.$^{-1}$, such as $3.9\times10^{-6}$ °C.$^{-1}$. In some embodiments, the inner stiffener ring 334 with the coefficient of thermal expansion α6 in the range from about $2\times10^{-6}$ °C.$^{-1}$ to about $6\times10^{-6}$ °C.$^{-1}$ may improve the reliability of the encapsulant 120 and the front-side redistribution structure 122 of the first package components 100 during operation. In some embodiments, inner stiffener ring 334 may comprise a metal alloy or the like. For example, inner stiffener ring 334 may comprise an iron-nickel alloy, which comprises about 55% to about 65% iron and about 35% to about 45% nickel, such as Alloy 42. As another example, inner stiffener ring 334 may comprise an iron-nickel-cobalt alloy, which comprises about 54% iron, about 29% nickel, and about 17% cobalt, such as Kovar. As another example, inner stiffener ring 334 may comprise a tungsten-copper alloy, which comprises about 70% to about 90% tungsten and about 10% to about 30% copper. As another example, inner stiffener ring 334 may comprise a molybdenum-copper alloy, which comprises about 50% to about 85% molybdenum and about 15% to about 50% copper. The inner stiffener ring 334 may have a thickness T10 in a range from about 1 mm to about 1.7 mm, such as about 1.24 mm.

Figure 29B:
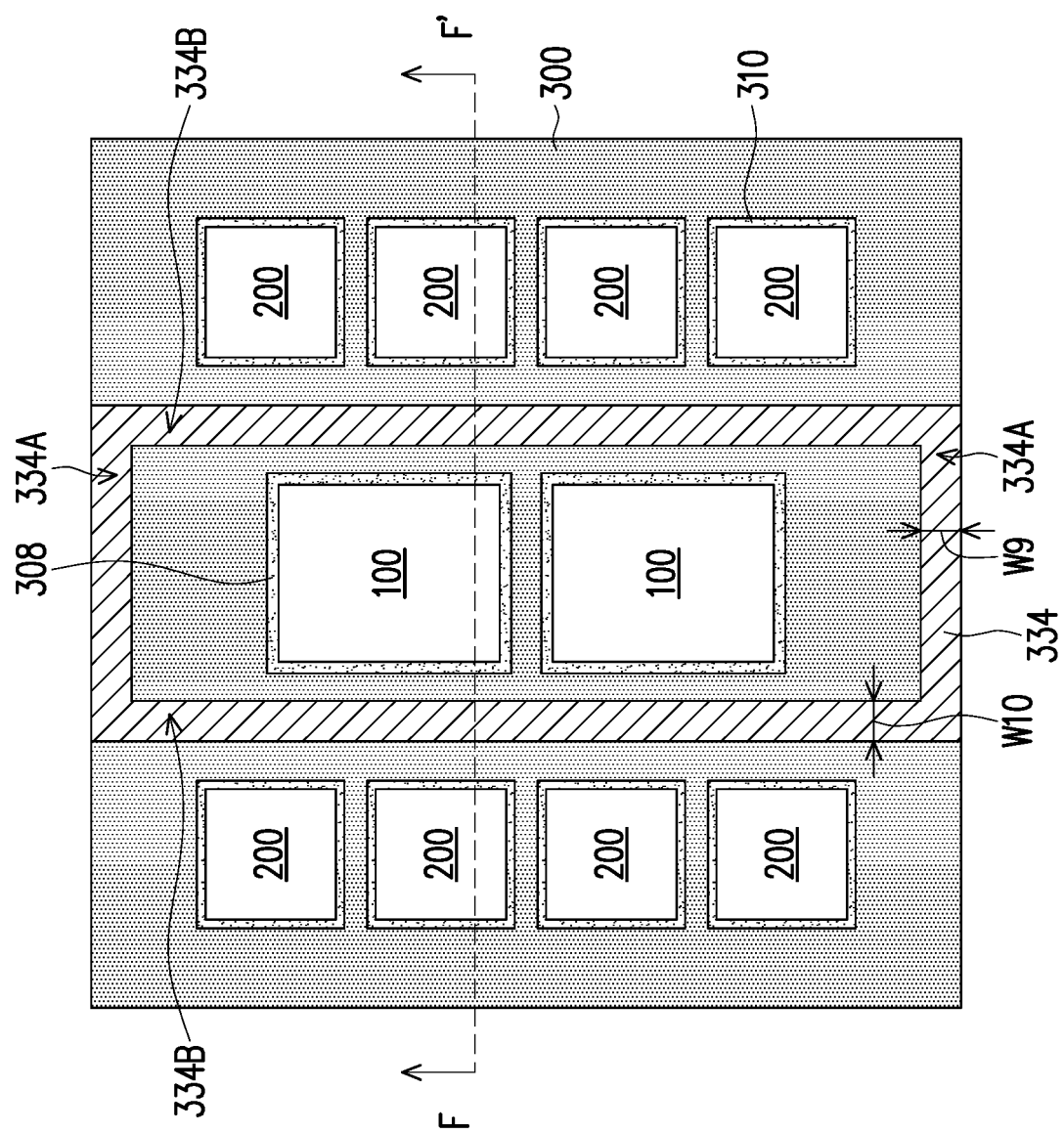

FIG. 29B shows a top view of the structure shown FIG. 29A. The cross-sectional view in FIG. 29A may be obtained from the reference cross-section F-F' in FIGS. 29B, wherein like reference numerals refer to like features. The reference cross-section F-F' may extend through one first package component 100 and two second package components 200 in a direction that is parallel to an outer edge of the package substrate 300. As shown in FIG. 29B, two first package components 100 are disposed adjacent a in a center region of the package substrate 300 and four second package components 200 disposed adjacent each outer edge of the package substrate 300. The inner stiffener ring 334 encircles the first package components 100, and separates the first package components 100 and the second package components 200. The numbers and arrangements of the first package components 100 and the second package components 200 shown in FIG. 29B are provided as an example. Other numbers and arrangements of the first package components 100 and the second package components 200 are possible.

The inner stiffener ring 334 may comprise two segments 334A that extend parallel to the reference cross-section F-F'. The segments 334A of the inner stiffener ring 334 may have a width W9, which may be in a range from about 1.8 mm to about 11 mm, such as about 1.8 mm. The inner stiffener ring 334 may comprise two segments 334B that extend perpendicular to the reference cross-section F-F' and between the first package components 100 and the second package components 200. The segments 334B of the inner stiffener ring 334 may have a width W10, which may be in a range from about 1.8 mm to about 11 mm, such as about 1.8 mm. In some embodiments, the width W9 may be substantially identical to the width W10.

In FIG. 30A, an outer stiffener ring 336 is attached to the package substrate 300 and the inner stiffener ring 334 utilizing the adhesive 335. The adhesive 335 may comprise the same or similar materials as the adhesive 314. The outer stiffener ring 336 may be used to provide additional support to the package substrate 300 during subsequent manufacturing processes and usage to reduce warpage or other types of deformation of the package substrate 300. As discussed in greater details below, the outer stiffener ring 336 may encircle the first package components 100 and the second package components 200. The outer stiffener ring 336 may be placed so that the outer stiffener ring 336 is laterally separated from the first package components 100, the second package components 200, the underfill 308 and the underfill 310.

The outer stiffener ring 336 may have a coefficient of thermal expansion α7, which may be in a range from about $8 \times 10^{-6\circ}$ C.$^{-1}$ to about $12 \times 10^{-6\circ}$ C.$^{-1}$, such as $10 \times 10^{-6\circ}$ C. In some embodiments, the coefficient of thermal expansion α7 of the outer stiffener ring 336 may be greater than the coefficient of thermal expansion α6 of the inner stiffener ring 334. As discussed in greater details below, in some embodiments, the lid 317 will be subsequently attached to the inner stiffener ring 334 and the outer stiffener ring 336 by the adhesive 318, wherein the coefficient of thermal expansion α7 of the outer stiffener ring 336 may be closer in value to a coefficient of thermal expansion α8 of the lid 317 than the coefficient of thermal expansion α6 of the inner stiffener ring 334 is to the coefficient of thermal expansion α8 of the lid 317. As a result, the configuration of the package 414 may prevent or reduce the delamination of the adhesive 318 from the inner stiffener ring 334, the outer stiffener ring 336, and the lid 317.

In some embodiments, the outer stiffener ring 336 may comprise a metal alloy or the like. For example, the outer stiffener ring 336 may comprise an iron-chromium alloy, which comprises about 82% to about 86% iron and about 14% to about 18% chromium, such as Stainless Steel 430. The outer stiffener ring 336 may have a thickness T11 in a range from about 1 mm to about 1.7 mm, such as about 1.24 mm. FIG. 29A shows the inner stiffener ring 334 and the outer stiffener ring 336 having greater thicknesses than the second package components 200 and the second package components 200 having a greater thickness than the first package components 100 as an example. Other thicknesses of the first package components 100, the second package components 200, the inner stiffener ring 334, and the outer stiffener ring 336 are possible.

FIG. 30B shows a top view of the structure shown FIG. 30A. The cross-sectional view in FIG. 29A may be obtained from the reference cross-section F-F' in FIGS. 30B, wherein like reference numerals refer to like features. As shown in FIG. 29B, the outer stiffener ring 336 may encircle the first package components 100, the second package components 200, and the segments 334B of the inner stiffener ring 334. The outer stiffener ring 336 may comprise two segments 336A that parallel to the reference cross-section F-F'. Portions of the segments 336A of the outer stiffener ring 336 adjacent the second package components 200 may have a width W11, which may be in a range from about 2 mm to about 10 mm, such as about 4.3 mm. Portions of the segments 336A of outer stiffener ring 336 adjacent the first package components 100 may have a width W12, which may be in a range from about 1.8 mm to about 11 mm, such as about 1.8 mm. In some embodiments, the width W11 may be greater than the width W12. In some embodiments, the width W12 may be substantially identical to the width W9 of the inner stiffener ring 334. Portions of the segments 336A of outer stiffener ring 336 adjacent the first package components 100 may be disposed over and may overlap with the segments 334A of the inner stiffener ring 334.

The outer stiffener ring 336 may comprise two segments 336B that extend perpendicular to the reference cross-section F-F' and along the outer edges of the package substrate 300. The segments 336B of the outer stiffener ring 336 may have a width W13, which may be in a range from about 1.8 mm to about 11 mm, such as about 1.8 mm. In some embodiments, the width W13 may be substantially identical to the width W10 of the inner stiffener ring 334.

FIGS. 29A to 30B show attaching the inner stiffener ring 334 to the package substrate 300 before attaching the outer stiffener ring 336 to the package substrate 300 and the inner stiffener ring 334 as an example. The inner stiffener ring 334 may be attached to the outer stiffener ring 336 before both the inner stiffener ring 334 and the outer stiffener ring 336 are attached to the package substrate 300 at the same time.

In FIG. 31A, the lid 317 is attached to the first package components 100 and the second package components 200 by the adhesive 320, and attached to the inner stiffener ring 334 and the outer stiffener ring 336 by the adhesive 318. The lid 317 may dissipate the heat generated by the first package components 100 and the second package components 200 during operation. As discussed previously, the composition, shape, and dimensions of the lid 317 may be substantially identical to the composition, shape, and dimensions of the lid 316, other than the omission of the first indents 322 and the second indents 324. The coefficient of thermal expansion α8 of the lid 317 may be substantially identical to the thermal expansion α3 of the lid 316, which may be in a range from about $14 \times 10^{-6}$ °C.$^{-1}$ to about $18 \times 10^{-6}$ °C.$^{-1}$, such as $16 \times 10^{-6}$ °C.$^{-1}$. In some embodiments, the coefficient of thermal expansion α8 of the lid 317 may be greater than the coefficient of thermal expansion α7 of the outer stiffening ring 336. In some embodiments, the difference between the coefficient of thermal expansion α7 of the outer stiffening ring 336 and the coefficient of thermal expansion α8 of the lid 317 is smaller than the difference between the coefficient of thermal expansion α6 of the inner stiffener ring 334 and the coefficient of thermal expansion α8 of the lid 317.

Advantages may be achieved by utilizing the outer stiffener ring 336 at select locations. The select locations where the outer stiffener ring 336 are located may correspond to areas where a large mismatch of the coefficients of thermal expansion between the lid 317 and the outer stiffener ring 336 may lead to delamination of the adhesive 318 from the lid 317, the inner stiffener ring 334, and the outer stiffener ring 336 during the usage of the package 400. Since the outer stiffener ring 336 has the coefficient of thermal expansion α7, which is closer in value to the coefficient of thermal expansion α8 of the lid 317 than the coefficient of thermal expansion α6 of the inner stiffener ring 334 is to the coefficient of thermal expansion α8 of the lid 317, the mismatch of the coefficients of thermal expansion at the select locations may be reduced. As such, the package 414 with the lid 317, the outer stiffener ring 336, and the inner stiffener ring 334 as described above may prevent or reduce delamination of the adhesive 318 from the lid 317, the inner stiffener ring 334, and the outer stiffener ring 336 during the usage of the package 414, thereby improving long-term reliability of the package 414.

Figure 31B:
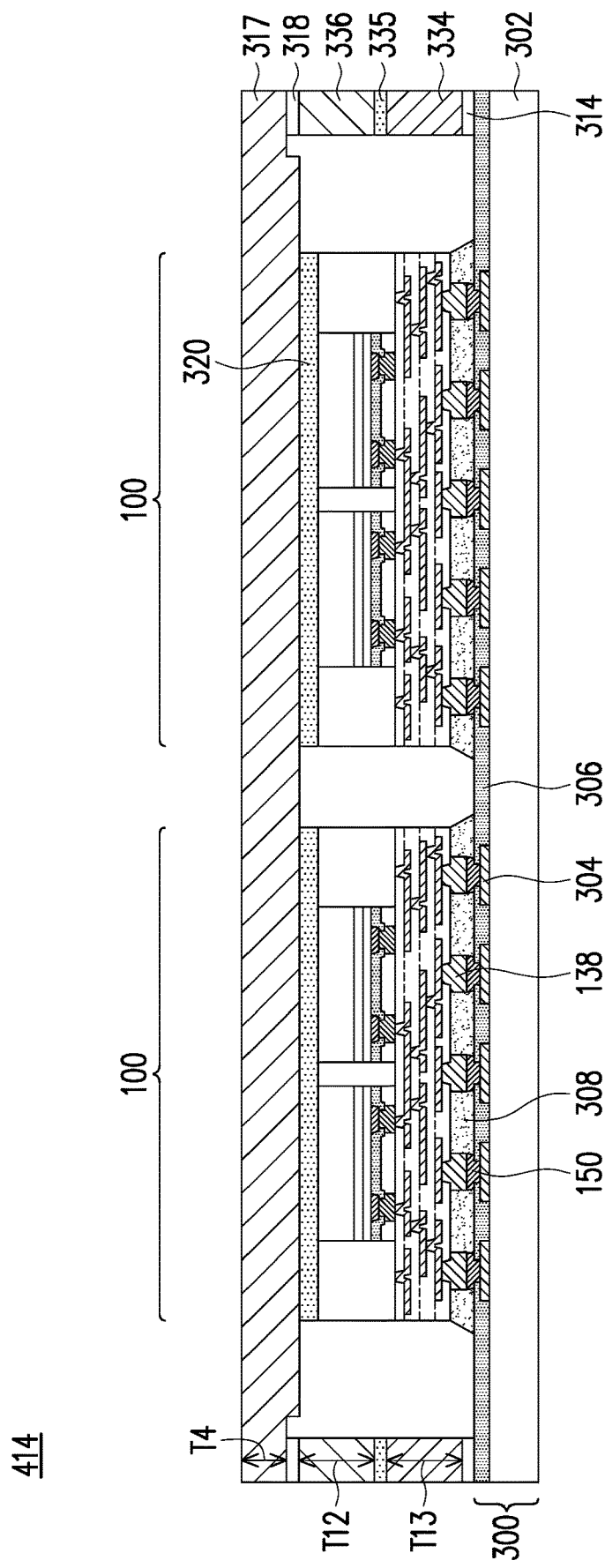

FIG. 31B shows another cross-sectional view of the package 414 shown in FIG. 31A, which may be obtained from the reference cross-section G-G' in FIG. 30B, wherein like reference numerals refer to like features. The reference cross-section G-G' may extend through two first package components 100 in a direction that is perpendicular to reference cross-section F-F'. As shown in FIG. 31B, portions of the outer stiffener ring 336 may be disposed over and may overlap with portions of the inner stiffener ring 334, and bottom surfaces of the outer stiffener ring 336 may be attached to top surfaces of the inner stiffener ring 334 by the adhesive 335. The portions of the outer stiffener ring 336 disposed between the lid 317 and the inner stiffener ring 334 may have a thickness T12, in a range from about 0.3 mm to about 1.4 mm, such as about 0.85 mm. The portions of the inner stiffener ring 334 disposed between the outer stiffener ring 336 and the package substrate 300 may have a thickness T13, in a range from about 0.3 mm to about 1.4 mm, such as about 0.85 mm. In some embodiments, the thickness T12 may be substantially identical to the thickness T13.

Figure 31C:
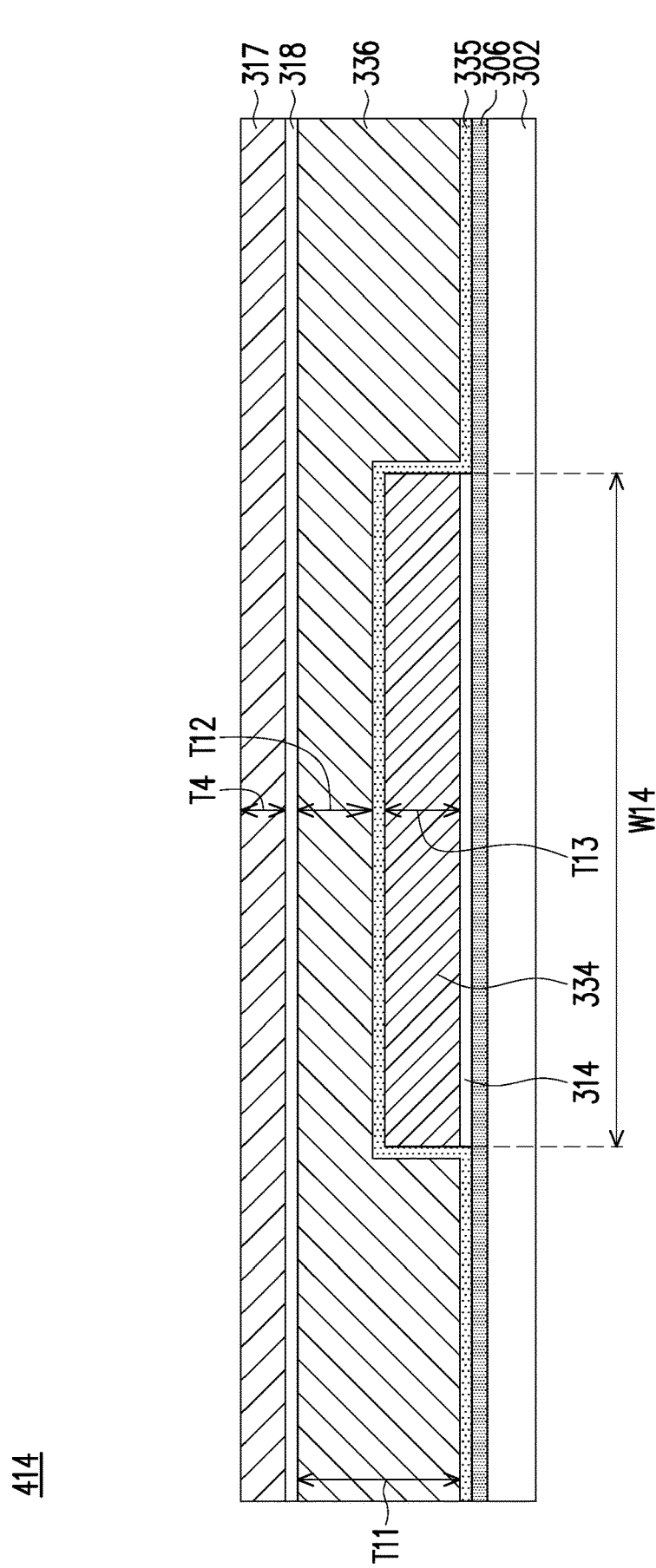

FIG. 31C shows another cross-sectional view of the package 414 shown in FIG. 31A, which may be obtained from the reference cross-section H-H' in FIG. 30B, wherein like reference numerals refer to like features. The reference cross-section H-H' may extend through the segment 336A of the outer stiffener ring 336 in a direction that is parallel to the reference cross-section F-F'. As shown in FIG. 31C, portions of the outer stiffener ring 336 may be attached to the lid 317 by the adhesive 318, and may be disposed over and may overlap with portions of the inner stiffener ring 334, wherein the bottom surface and inner sidewalls of the outer stiffener ring 336 may be attached to the top surface and outer sidewalls of the inner stiffener ring 334 by the adhesive 335, respectively. The portion of the inner stiffener ring 334 disposed underneath the outer stiffener ring 336 and extend between inner sidewalls of the outer stiffener ring 336 may have a width W14, in a range from about 8 mm to about 20 mm, such as about 15 mm. Other portions of the outer stiffener ring 336 may be attached to the lid 317 by the adhesive 318 and to the package substrate 300 by the adhesive 335.

Figure 31D:
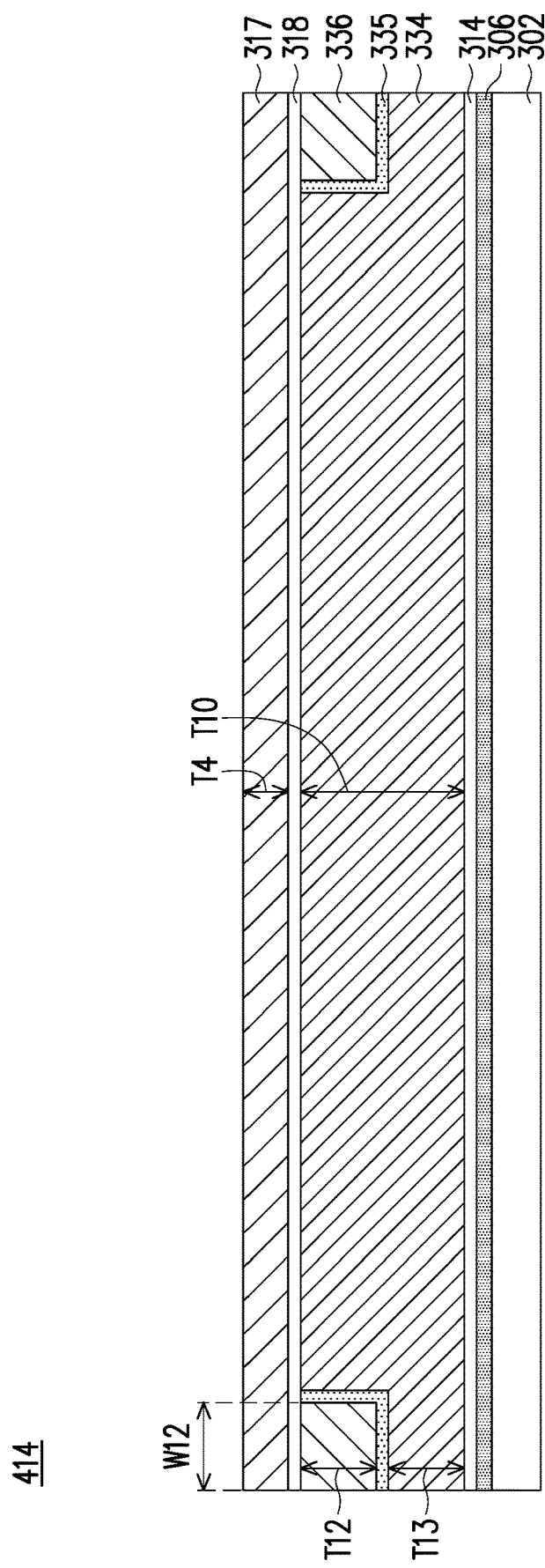

FIG. 31D shows another cross-sectional view of the package 414 shown in FIG. 31A, which may be obtained from the reference cross-section I-I' in FIG. 30B, wherein like reference numerals refer to like features. The reference cross-section I-I' may extend through the segment 334B of the inner stiffener ring 334 in a direction that is parallel to the reference cross-section F-F'. As shown in FIG. 31A, portions of the inner stiffener ring 334 may be attached to the package substrate 300 by the adhesive 314, and may be disposed underneath and may overlap with portions of the outer stiffener ring 336, wherein the top surfaces and outer sidewalls of the inner stiffener ring 334 may be attached to the bottom surfaces and inner sidewalls of the outer stiffener ring 336 by the adhesive 335, respectively. Other portions of the inner stiffener ring 334 may be attached to the lid 317 by the adhesive 318 and to the package substrate 300 by the adhesive 314.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By utilizing the one or more stiffener rings of various configurations and the lid of various configurations in the package, the mismatch of the coefficients of thermal expansion between the lid and the one or more stiffener rings may be mitigated or eliminated, which may prevent or reduce delamination of the various adhesives from the lid and the one or more stiffener rings during the usage of the package, thereby improving long-term reliability of the package.

In an embodiment, a semiconductor package includes a substrate; a first package component bonded to the substrate, wherein the first package component includes a first semiconductor die; a ring structure attached to the substrate, wherein the ring structure encircles the first package component in a top view, the ring structure including: a first segment, extending along a first edge of the substrate; a second segment, extending along a second edge of the substrate, wherein the first segment and the second segment meet at a first corner of the ring structure, and wherein a first indent of the ring structure is disposed at the first corner of the ring structure; and a lid structure attached to the ring structure. In an embodiment, the semiconductor package further includes a third segment, wherein the third segment is parallel with the second segment, wherein the third segment and the first segment meet at a first intersection of the ring structure, and wherein a second indent of the ring structure is disposed at the first intersection of the ring structure. In an embodiment, a first indent of the lid structure overlaps and faces the second indent of the ring structure. In an embodiment, a first indent of the lid structure overlaps and faces the first indent of the ring structure. In an embodiment, the first indent of the ring structure extends completely through the ring structure, and wherein a protrusion of the lid structure is disposed in the first indent of the ring structure and is attached to the substrate. In an embodiment, the semiconductor package further includes a third segment, wherein the third segment is parallel with the second segment, wherein the third segment and the first segment meet at a first intersection of the ring structure, and wherein a first indent of the lid structure is disposed over the first intersection of the ring structure. In an embodiment, the semiconductor package further includes a third segment, wherein the third segment is parallel with the second segment, wherein the third segment and the first segment meet at a first intersection of the ring structure, and wherein a second indent of the ring structure is disposed at the first intersection of the ring structure. In an embodiment, a first indent of the lid structure is disposed over the first intersection of the ring structure, and wherein the first indent of the lid structure overlaps and faces the second indent of the ring structure.

In an embodiment, a semiconductor package includes a substrate; a first package component bonded to the substrate, wherein the first package component includes a first semiconductor die; a second package component bonded to the substrate, wherein the second package component includes a second semiconductor die; a first ring structure attached to the substrate, wherein the first ring structure includes a first material, and wherein the first ring structure encircles the first package component in a top view; a second ring structure attached to the substrate, wherein the second ring structure includes a second material different from the first material, and wherein a coefficient of thermal expansion of the second ring structure is greater than a coefficient of thermal expansion of the first ring structure; and a lid structure over and attached to the second ring structure. In an embodiment, the second ring structure encircles the first package component and the second package component in the top view. In an embodiment, the lid structure includes a third material different from the first material and the second material, wherein a coefficient of thermal expansion of the lid structure is greater than the coefficient of thermal expansion of the second ring structure. In an embodiment, a first segment of the first ring structure extends along a first edge of the substrate and a first segment of the second ring structure extends along the first edge of the substrate, and wherein the first segment of the second ring structure is disposed over the first segment of the first ring structure and is attached to the lid structure. In an embodiment, a second segment of the first ring structure is perpendicular to the first segment of the first ring structure, and wherein the second segment of the first ring structure separates the first package component and the second package component. In an embodiment, the second segment of the first ring structure is attached to the lid structure.

In an embodiment, a method of manufacturing a semiconductor package includes bonding a first package component to a substrate, wherein the first package component includes a first semiconductor die; attaching a frame structure to the substrate, wherein the frame structure encircles the first package component in a top view, the frame structure including a first bar, extending along a first edge of the substrate; a second bar, extending along a second edge of the substrate, wherein the first bar and the second bar converge at a first corner of the frame structure; and attaching a lid structure to the frame structure, wherein a first indent in the lid structure is disposed over the first corner of the frame structure. In an embodiment, the method further includes bonding a second package component to the substrate, wherein the second package component includes a second semiconductor die, wherein the first package component and the second package component are separated by a third bar of the frame structure, wherein the third bar is perpendicular to the first bar, and wherein the third bar and the first bar converge at a first junction. In an embodiment, a second indent of the lid structure is disposed over the first junction of the frame structure. In an embodiment, a first indent of the frame structure is disposed underneath the first indent of the lid structure, wherein the first indent of the frame structure overlaps and faces the first indent of the lid structure, wherein a second indent of the frame structure is disposed underneath the second indent of the lid structure, and wherein the second indent of the frame structure overlaps and faces the second indent of the lid structure. In an embodiment, the frame structure includes a first material, and the lid structure includes a second material different from the first material. In an embodiment, the first material has a first coefficient of thermal expansion and the second material has a second coefficient of thermal expansion, and wherein the second coefficient of thermal expansion is greater than the first coefficient of thermal expansion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
   a substrate;
   a first package component bonded to the substrate, wherein the first package component comprises a first semiconductor die;
   a ring structure attached to the substrate, wherein the ring structure encircles the first package component in a top view, the ring structure comprising:
      a first segment, extending along a first edge of the substrate;
      a second segment, extending along a second edge of the substrate, wherein the first segment and the second segment meet at a first corner of the ring structure, wherein a first indent of the ring structure is disposed at the first corner of the ring structure, and wherein the first indent of the ring structure extends completely through the ring structure; and
   a lid structure attached to the ring structure, wherein a protrusion of the lid structure is disposed in the first indent of the ring structure and is attached to the substrate.

2. The semiconductor package of claim 1, further comprising a third segment, wherein the third segment is parallel with the second segment, wherein the third segment and the first segment meet at a first intersection of the ring structure, and wherein a first indent of the lid structure is disposed over the first intersection of the ring structure.

3. The semiconductor package of claim 2, wherein the first indent of the lid has a shape of a rectangle in a top-down view.

4. The semiconductor package of claim 2, wherein the first indent of the lid has a shape of an "L" in a top-down view.

5. The semiconductor package of claim 1, further comprising a third segment, wherein the third segment is parallel with the second segment, wherein the third segment and the first segment meet at a first intersection of the ring structure, and wherein a second indent of the ring structure is disposed at the first intersection of the ring structure.

6. The semiconductor package of claim 5, wherein a first indent of the lid structure is disposed over the first intersection of the ring structure, and wherein the first indent of the lid structure overlaps and faces the second indent of the ring structure.

7. The semiconductor package of claim 1, wherein the lid structure is attached to the ring structure by a first adhesive, and where the protrusion of the lid is attached to the substrate by the first adhesive.

8. The semiconductor package of claim 1, wherein a coefficient of thermal expansion of the lid is greater than a coefficient of thermal expansion of the ring structure.

9. A semiconductor package comprising:
a substrate;
a first package component bonded to the substrate, wherein the first package component comprises a first semiconductor die;
a second package component bonded to the substrate, wherein the second package component comprises a second semiconductor die;
a first ring structure attached to the substrate by a first adhesive, wherein the first ring structure comprises a first material, and wherein the first ring structure encircles the first package component in a top view;
a second ring structure attached to the substrate by a second adhesive, wherein the second adhesive is in contact with the substrate, the first ring structure, and the second ring structure, wherein the second ring structure comprises a second material different from the first material, and wherein a coefficient of thermal expansion of the second ring structure is greater than a coefficient of thermal expansion of the first ring structure; and
a lid structure over and attached to the second ring structure.

10. The semiconductor package of claim 9, wherein the second ring structure encircles the first package component and the second package component in the top view.

11. The semiconductor package of claim 9, wherein the lid structure comprises a third material different from the first material and the second material, wherein a coefficient of thermal expansion of the lid structure is greater than the coefficient of thermal expansion of the second ring structure.

12. The semiconductor package of claim 9, wherein a first segment of the first ring structure extends along a first edge of the substrate and a first segment of the second ring structure extends along the first edge of the substrate, and wherein the first segment of the second ring structure is disposed over the first segment of the first ring structure and is attached to the lid structure.

13. The semiconductor package of claim 12, wherein a second segment of the first ring structure is perpendicular to the first segment of the first ring structure, and wherein the second segment of the first ring structure separates the first package component and the second package component.

14. The semiconductor package of claim 13, wherein the second segment of the first ring structure is attached to the lid structure.

15. A method of manufacturing a semiconductor package, the method comprising:
bonding a first package component to a substrate, wherein the first package component comprises a first semiconductor die;
attaching a frame structure to the substrate, wherein the frame structure encircles the first package component in a top view, the frame structure comprising:
a first bar, extending along a first edge of the substrate;
a second bar, extending along a second edge of the substrate, wherein the first bar and the second bar converge at a first corner of the frame structure; and
attaching a lid structure to the frame structure by an adhesive, wherein a first indent in the lid structure is disposed over the first corner of the frame structure, wherein the adhesive fills up the first indent, and wherein the adhesive is in contact with a sidewall of the first indent.

16. The method of claim 15, further comprising bonding a second package component to the substrate, wherein the second package component comprises a second semiconductor die, wherein the first package component and the second package component are separated by a third bar of the frame structure, wherein the third bar is perpendicular to the first bar, and wherein the third bar and the first bar converge at a first junction.

17. The method of claim 16, wherein a second indent of the lid structure is disposed over the first junction of the frame structure.

18. The method of claim 17, wherein a first indent of the frame structure is disposed underneath the first indent of the lid structure, wherein the first indent of the frame structure overlaps and faces the first indent of the lid structure, wherein a second indent of the frame structure is disposed underneath the second indent of the lid structure, and wherein the second indent of the frame structure overlaps and faces the second indent of the lid structure.

19. The method of claim 15, wherein the frame structure comprises a first material, and the lid structure comprises a second material different from the first material.

20. The method of claim 19, wherein the first material has a first coefficient of thermal expansion and the second material has a second coefficient of thermal expansion, and wherein the second coefficient of thermal expansion is greater than the first coefficient of thermal expansion.

* * * * *